(12) United States Patent
Kou et al.

(10) Patent No.: US 6,483,304 B1
(45) Date of Patent: Nov. 19, 2002

(54) MAGNETIC FIELD PROBE HAVING A SHIELDING AND ISOLATING LAYERS TO PROTECT LEAD WIRES EXTENDING BETWEEN A COIL AND PADS

(75) Inventors: Futoyoshi Kou, Miyagi; Yoshiyuki Kiyosawa, Kanagawa, both of (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/041,041

(22) Filed: Mar. 12, 1998

(30) Foreign Application Priority Data

Mar. 13, 1997 (JP) ............................................. 9-059267

(51) Int. Cl.⁷ .......................... G01R 29/08; G01R 33/02
(52) U.S. Cl. ....................................... 324/258; 324/225
(58) Field of Search ................................. 324/258, 256, 324/257, 260, 244, 225, 248; 336/200, 232, 84 B, 84 C, 84 M; 343/841, 851, 905, 906; 257/659, 660, 662

(56) References Cited

U.S. PATENT DOCUMENTS 4,613,843 A * 9/1986 Esper et al. ............ 324/207.17
4,814,849 A * 3/1989 Schrenk ........................ 357/74
5,523,686 A * 6/1996 Kirtley et al. ............... 324/248
5,524,490 A * 6/1996 Lautzenhiser et al. . 324/207.17
5,600,243 A * 2/1997 Colcough .................... 324/248

FOREIGN PATENT DOCUMENTS

| JP | 58-48877 | 3/1983 |
| JP | 62-106379 | 5/1987 |
| JP | 7-191058 | 7/1995 |

* cited by examiner

*Primary Examiner*—Walter E. Snow
(74) *Attorney, Agent, or Firm*—Oblon, Spivak, McClelland, Maier & Neustadt, P.C.

(57) ABSTRACT

A magnetic field probe includes a substrate and a conductive layer provided on the substrate. The conductive layer has a coil, lead wires, and pads. The coil has at least one turn and outputs a signal indicative of a magnetic field from a device under test in a vicinity of the magnetic field probe. The lead wires extend from the coil to the pads, the signal from the coil being transmitted to the pads through the lead wires. An isolating layer of a dielectric material is provided on the lead wires to protect the lead wires between the coil and the pads in the conductive layer. A shielding layer of a conductive material is provided on the isolating layer to protect the isolating layer. The shielding layer prevents distortion of the magnetic field at the lead wires in conjunction with the isolating layer.

19 Claims, 24 Drawing Sheets

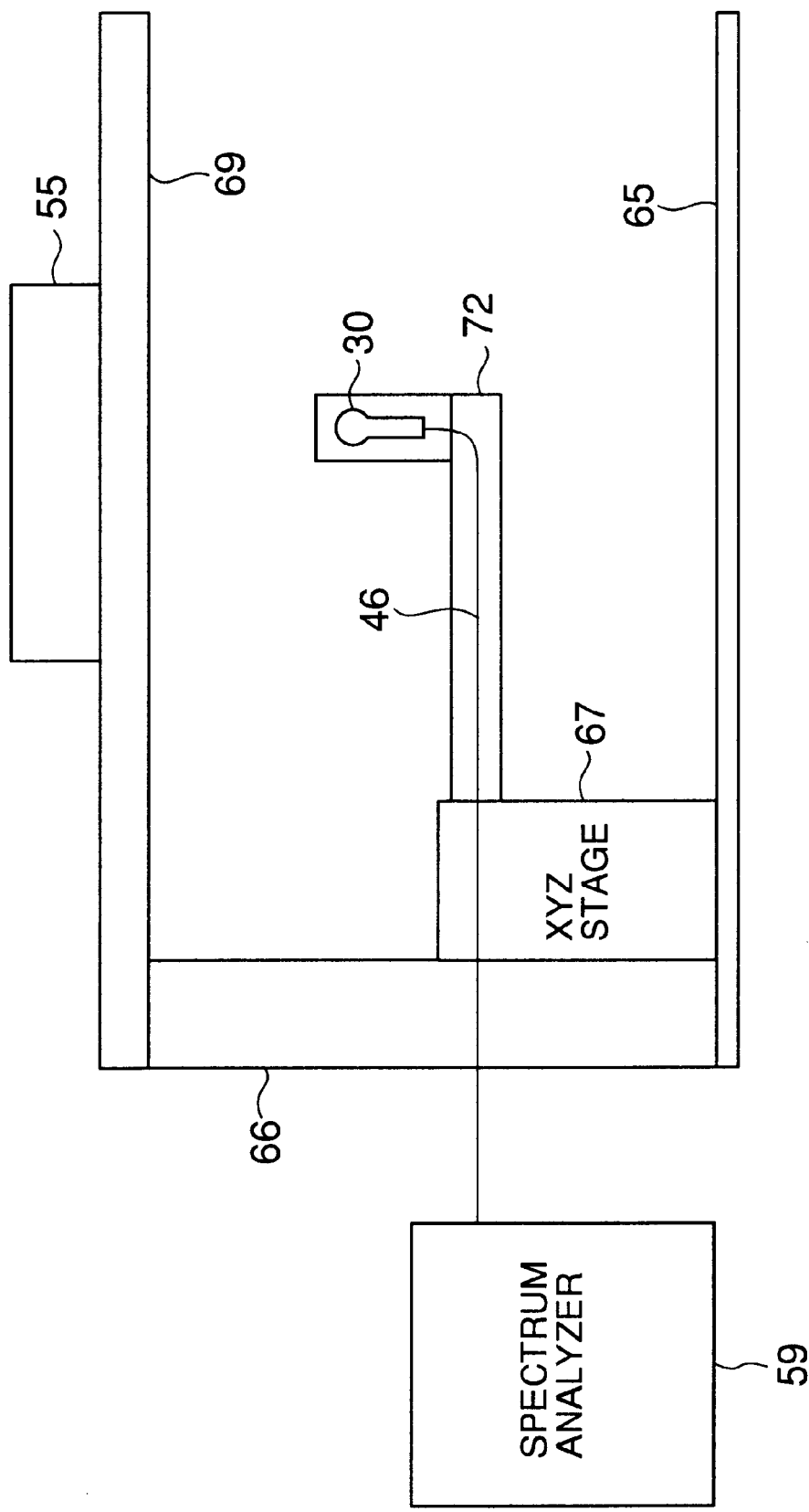

MAGNETIC FIELD PROBE HAVING A SHIELDING AND ISOLATING LAYERS TO PROTECT LEAD WIRES EXTENDING BETWEEN A COIL AND PADS

BACKGROUND OF THE INVENTION (1) Field of the Invention

The present invention relates to a magnetic field probe which provides detection of a magnetic field from a device under test in the vicinity of the probe. Further, the present invention relates to a magnetic field measuring system having at least one magnetic field probe in which a magnetic field measurement is performed by detection of a magnetic field from a device under test in the vicinity of the probe.

The present invention is applied to magnetic field measurement to measure electromagnetic noise or electric current as an unwanted electromagnetic signal produced by electrical devices, electronic devices and printed circuit boards provided therein. Such a noise may degrade the performance of the electrical/electronic devices. The results of the magnetic field measurement are used to take preventive measures to reduce the electromagnetic noise from the electrical/electronic devices and the printed circuit boards therein, so as to be in compliance with legal electromagnetic compatibility (EMC) controls or electromagnetic interference prevention.

(2) Description of the Related Art

Legal electromagnetic compatibility (EMC) controls are provided in order to take preventive measures for electrical devices, electronic devices and printed circuit boards provided therein to reduce electromagnetic noise produced by the electrical/electronic devices and the printed circuit boards to a level below the specified level of the legal EMC controls. In order to take preventive measures for the electrical/electronic devices and the printed circuit boards, the legal EMC controls provide some procedures of magnetic field measurement to measure electromagnetic noise or electric current as the source of electromagnetic noise produced by a device under test (DUT).

As one of the above-mentioned procedures of magnetic field measurement, an electromagnetic field at a remote location (for example, at a distance of 10 or 30 meters) of a device under test (DUT) in an open site or within a radio-frequency anechoic chamber as specified by the legal EMC controls is measured by using a specified antenna. The result of the measurement by this procedure is used to take preventive measures for the electrical/electronic devices and the printed circuit boards in order to be in compliance with the legal EMC controls.

There is another procedure of magnetic field measurement. In this procedure, a magnetic field of the device under test (DUT) in the vicinity of a magnetic field probe is detected, and a magnetic field measurement is carried out by detection of the magnetic field from the DUT. This procedure is performed prior to performing the measurement in the open site or within the radio-frequency anechoic chamber. The result of the magnetic field measurement by this procedure is used to take preventive measures for the electrical/electronic devices and the printed circuit boards in order to be in compliance with the legal EMC controls. A description of the related art of the present invention will be given below.

Japanese Laid-Open Patent Application No. 58-048877 discloses a search coil which detects a magnetic field from a device under test, and a method of production of the search coil. In the search coil of the above-mentioned publication, a coil having a concentric arrangement is provided on a flexible substrate which is 0.1–0.3 mm thick, and stranded cables are connected to the ends of the coil. In the production method for the search coil, a metallic foil of copper which is 0.03–0.06 mm thick is attached to the flexible substrate, and a photo-lithographic process is performed so that a coil having a concentric arrangement is formed on the substrate by the metallic foil. The stranded cables are connected to wires from the ends of the coil.

In the search coil of the above-mentioned publication, a wire connection must be provided between the ends of the coil and the stranded cables. In a case in which a small coil having a size below 1 mm is provided in a magnetic field probe, a magnetic field from the device under test may distort in the wire connection in the search coil. The distortion of magnetic field may produce a significant error in the magnetic field detection, and the search coil of the above publication fails to provide adequate accuracy of a magnetic field measurement.

Japanese Laid-Open Patent Application No. 62-106379 discloses a magnetic field measuring probe which detects a magnetic field from a device under test. In the probe of the above-mentioned publication, two looped coils having a symmetric arrangement, and microstrip transmission lines which receive signals from the coils are provided. The transmission lines extend from the coils via lead wires. The coils are not shielded, and the transmission lines are shielded by a shield case.

In the magnetic field measuring probe of the above-mentioned publication, a wire connection must be provided between the coils and the transmission lines. In a case in which a small coil having a size below 1 mm is provided in a magnetic field probe, a magnetic field from the device under test may distort in the wire connection in the probe. The distortion of magnetic field may produce a significant error in the magnetic field detection, and the probe of the above publication fails to provide adequate accuracy of a magnetic field measurement. In addition, in the magnetic field measuring probe of the above publication, the probe including the coils and the transmission lines are packaged on a substrate of a printed circuit board. It is difficult to provide a small coil having a size below 1 mm in the probe.

Japanese Laid-Open Patent Application No. 7-191058 discloses a microwave frequency testing device. In the testing device of the above-mentioned publication, a sensor is provided on a microwave transmission line on a flexible substrate, the sensor being formed by etching. A lead wire extends from the sensor in an elbow-like manner, and an output connector at the leading edge of the lead wire is connected to the sensor through the lead wire.

In the testing device of the above-mentioned publication, a wire connection must be provided between the sensor and the output connector. In a case in which a small coil having a size below 1 mm is provided in a magnetic field probe, a magnetic field from the device under test may distort in the wire connection in the testing device. The distortion of the magnetic field may produce a significant error in the magnetic field detection, and the testing device of the above publication fails to provide adequate accuracy of a magnetic field measurement.

SUMMARY OF THE INVENTION

An object of the present invention is to provide an improved magnetic field probe in which the above-described problems are eliminated.

Another object of the present invention is to provide a magnetic field probe which efficiently prevents the distortion of a magnetic field at the lead wires between a coil and pads within the probe, and provides adequate accuracy of a magnetic field measurement for a device under test in the vicinity of the probe.

Still another object of the present invention is to provide a magnetic field measuring system having at least one probe which efficiently prevents the distortion of the magnetic field at the lead wires between a coils and pads within the pad, so that the measuring system provides adequate accuracy of a magnetic field measurement for a device under test in the vicinity of the probe.

The above-mentioned objects of the present invention are achieved by a magnetic field probe comprising: a substrate; a conductive layer, provided on the substrate, which has a coil, lead wires, and pads, the coil having one or a plurality of turns and outputting a signal indicative of a magnetic field from a device under test in the vicinity of the magnetic field probe, the lead wires extending from the coil to the pads, the signal from the coil being transmitted to the pads through the lead wires; an isolating layer of a dielectric material which is provided on the lead wires to protect the lead wires between the coil and the pads in the conductive layer; and a shielding layer of a conductive material which is provided on the isolating layer to protect the isolating layer, wherein the shielding layer prevents distortion of the magnetic field at the lead wires in conjunction with the isolating layer.

The above-mentioned objects of the present invention are achieved by a magnetic field measuring system comprising: at least one probe; and a probe supporting member which supports the at least one probe thereon, the at least one probe comprising: a substrate; a conductive layer, provided on the substrate, which has a coil, lead wires, and pads, the coil having one or a plurality of turns and outputting a signal indicative of a magnetic field from a device under test in the vicinity of the magnetic field probe, the lead wires extending from the coil to the pads, the signal from the coil being transmitted to the pads through the lead wires; an isolating layer of a dielectric material which is provided on the lead wires to protect the lead wires between the coil and the pads in the conductive layer; and a shielding layer of a conductive material which is provided on the isolating layer to protect the isolating layer, wherein the shielding layer prevents distortion of the magnetic field at the lead wires in conjunction with the isolating layer.

The above-mentioned objects of the present invention are achieved by a magnetic field probe comprising: a substrate; a first conductive layer which is provided on the substrate to partially cover the substrate, the first conductive layer having an external peripheral portion; a first isolating layer which is provided on the first conductive layer to overlap with the first conductive layer; a second conductive layer which is provided on the first isolating layer, the second conductive layer having a coil, an internal conductor, and a first pad, the coil having a first end connected to the external peripheral portion of the first conductor layer and having a second end connected to the internal conductor, the coil outputting a signal indicative of a magnetic field from a device under test in the vicinity of the probe, the internal conductor extending from the coil to the first pad, the signal from the coil being transmitted to the first pad through the internal conductor; a second isolating layer which is provided on both the first isolating layer and the second conductive layer to overlap with the first isolating layer so that the internal conductor in the second conductive layer is protected by the second isolating layer; and a third conductive layer which is provided on the second isolating layer, the third conductive layer being connected to the first conductive layer at positions on both sides of the internal conductor so that the first and the third conductive layers form a shielding layer to protect the internal conductor in the second conductive layer, the shielding layer preventing distortion of the magnetic field at the internal conductor in conjunction with the second isolating layer, wherein a second pad is provided in the third conductive layer, the second pad being connected to the first end of the coil through the external peripheral portion of the first conductive layer.

The above-mentioned objects of the present invention are achieved by a magnetic field measuring system comprising: at least one probe; and a probe supporting member for supporting the at least one probe thereon, the at least one probe comprising: a substrate; a first conductive layer which is provided on the substrate to partially cover the substrate, the first conductive layer having an external peripheral portion; a first isolating layer which is provided on the first conductive layer to overlap with the first conductive layer; a second conductive layer which is provided on the first isolating layer, the second conductive layer having a coil, an internal conductor, and a first pad, the coil having a first end connected to the external peripheral portion of the first conductor layer and having a second end connected to the internal conductor, the coil outputting a signal indicative of a magnetic field from a device under test in the vicinity of the probe, the internal conductor extending from the coil to the first pad, the signal from the coil being transmitted to the first pad through the internal conductor; a second isolating layer which is provided on both the first isolating layer and the second conductive layer to overlap with the first isolating layer so that the internal conductor in the second conductive layer is protected by the second isolating layer; and a third conductive layer which is provided on the second isolating layer, the third conductive layer being connected to the first conductive layer at positions on both sides of the internal conductor so that the first and the third conductive layers form a shielding layer to protect the internal conductor in the second conductive layer, the shielding layer preventing distortion of the magnetic field at the internal conductor in conjunction with the second isolating layer, wherein a second pad is provided in the third conductive layer, the second pad being connected to the first end of the coil through the external peripheral portion of the first conductive layer.

The magnetic field probe and the magnetic field measuring system of the present invention are effective in preventing the distortion of the magnetic field at the lead wires between the coil and the pads within the probe, and provides adequate accuracy of a magnetic field measurement for the device under test in the vicinity of the probe. The magnetic field probe and the magnetic field measuring system of the present invention allow accurate measurement to be performed of a magnetic field signal within a radio frequency range, enable a three-dimensional measurement or vector measurement of a magnetic field to be performed, and allow accurate detection of a small magnetic field from the device under test to be performed. Also, it is possible to measure a distribution of a magnetic field from the device under test with high accuracy. By using the magnetic field probe and the magnetic field measuring system of the present invention, it is possible to obtain the results of the magnetic field measurement with high accuracy, and the results of the magnetic field measurement are useful to take preventive measures to reduce electromagnetic noise from electrical/ electronic devices and printed circuit boards therein, so as to be in compliance with legal electromagnetic compatibility (EMC) controls. This makes it possible to reduce the period needed for development of new products.

BRIEF DESCRIPTION OF THE DRAWINGS

Other objects, features and advantages of the present invention will be more apparent from the following detailed description when read in conjunction with the accompanying drawings in which:

FIG. 26 is a diagram for explaining a construction of another magnetic field measuring system in which a spectrum analyzer is connected to the probe.

DETAILED DESCRIPTION OF THE PREFERRED EMBODIMENTS

A description will now be given of the preferred embodiments of the present invention with reference to the accompanying drawings.

Figure 1A:
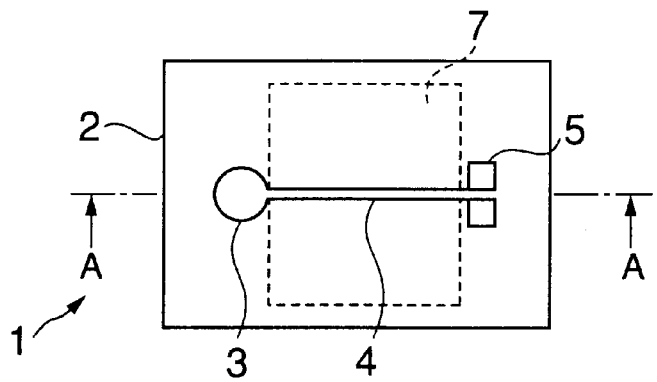
FIG. 1A through FIG. 1D are views of one embodiment of a magnetic field probe of the present invention.
Figure 1B:
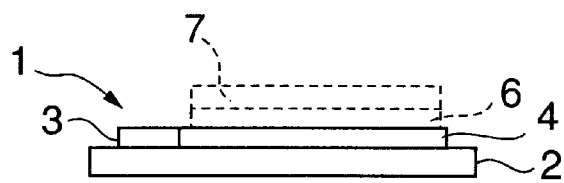
Figure 1C:
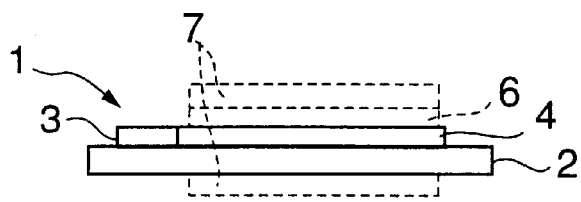
Figure 1D:
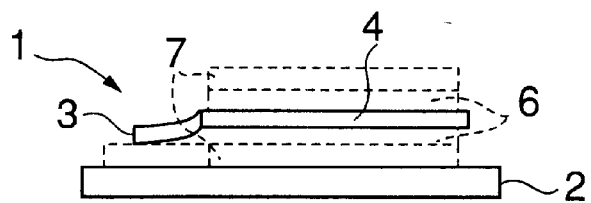

FIG. 1A through FIG. 1D show one embodiment of a magnetic field probe of the present invention. FIG. 1A is a top view of the magnetic field probe 1 of the present embodiment. FIG. 1B is a cross-sectional view of the magnetic field probe 1 taken along a line A—A in FIG. 1A. FIG. 1C and FIG. 1D are cross-sectional views of modifications of the magnetic field probe 1 taken along the line A—A in FIG. 1A.

As shown in FIGS. 1A and 1B, the magnetic field probe 1 of the present embodiment generally has a substrate 2, a thin-film coil 3, lead wires 4, and pads 5. The coil 3 is formed in one or a plurality of turns by a thin film on the substrate 1. When a magnetic field from a device under test (DUT) in the vicinity of the probe 1 is detected, the coil 3 produces a signal indicating the magnetic field, and the signal from the coil 3 is transmitted through the lead wires 4 to the pads 5. If a magnetic field measuring system (not shown) including a spectrum analyzer or the like is connected to the pads 5 of the probe 1 via a coaxial cable or the like, the magnetic field signal from the probe 1 is transmitted to the magnetic field measuring system via the coaxial cable, so that a measurement of the magnetic field from the device under test (DUT) is performed.

In order to facilitate understanding of the magnetic field probe 1 of the present embodiment, a description will be given of a method of production of the magnetic field probe 1 of the present embodiment.

In a case of the magnetic field probe which has a single-turn coil, the magnetic field probe 1 is produced as follows. First, a thin film of aluminum (Al) is deposited on a substrate of quartz by sputtering. A photolithographic process and a wet etching process are performed so that the coil 3, the lead wires 4 and the pads 5 are formed on the substrate 1 by the aluminum layer. In the wet etching process, aqueous solutions of acids, such as $H_3PO_4$, $HNO_3$ and $CH_3COOH$, are used.

Second, a thin film of silicon dioxide ($SiO_2$) is deposited on the lead wires 4 by sputtering. A photolithographic process and a reactive ion etching are performed so that an isolating layer 6 is formed on the lead wires 4 by the silicon dioxide layer as indicated by a dotted line in FIG. 1B. In the reactive ion etching, $CF_4$ and $H_2$ are used.

Finally, a thin film of aluminum is deposited on the isolating layer 6 by sputtering, and a photolithographic process and a wet etching process, which are the same as those mentioned above, are performed so that a shielding layer 7 is formed on the isolating layer 6 by the aluminum layer as indicated by a dotted line in FIG. 1B.

In a case of the magnetic field probe which has a multiple-turn coil, the magnetic field probe 1 is produced as follows. First, the procedures for forming the coil 3 on the substrate 1 by the aluminum layer, which are the same as those mentioned above with respect to the magnetic field probe having the single-turn coil, are performed. After the single-turn coil 3 is formed at a corresponding portion on the substrate 1, a thin film of silicon dioxide ($SiO_2$) is deposited on the single-turn coil 3 by sputtering, a through hole is formed therein, and a second turn of the coil 3 is formed at the corresponding portion on the substrate 1 by the aluminum layer. These procedures are repeated to form third and subsequent turns of the coil 3 thereon, so that a multiple-turn coil 3 is formed at the corresponding portion on the substrate 1.

After the multiple-turn coil 3 is formed at the corresponding portion on the substrate 1, the lead wires 4 and pads 5 are formed on the substrate 1 by the aluminum layer in a manner that is the same as that described above with respect to the magnetic field probe having the single-turn coil. Next, the isolating layer 6 is formed on the lead wires 4 by the silicon dioxide layer in the same manner. Further, the shielding layer 7 is formed on the isolating layer 6 by the aluminum layer in the same manner.

As described above, in the magnetic field probe 1 of the present embodiment, the top and sides of the lead wires 4 are electromagnetically protected by the isolating layer 6 which is dielectric to electric current, and further the isolating layer 6 is electromagnetically protected by the shielding layer 7 which is conductive to electric current. Therefore, the magnetic field probe 1 of the present embodiment is effective in preventing the distortion of a magnetic field at the lead wires 4 between the coil 3 and the pads 5 within the probe 1, and it is possible to provide adequate accuracy for magnetic field measurement of the device under test.

In the above-described embodiment, the coil 3, the lead wires 4 and the pads 5 are made of aluminum (Al). Alternatively, one of other metallic materials such as silver (Ag), gold (Au) and platinum (Pt) may be used to form the coil 3, the lead wires 4 and the pads 5 on the substrate 2. In the above-described embodiment, the substrate 2 is made of quartz. Alternatively, one of other isolating substrate materials or flexible isolating substrate materials (such as polyethylene terephthalate and polyimide) may be used to form the substrate 2.

In the above-described production method, the sputtering process is used to form the conductive thin layer of the coil 3, the lead wires 4 and the pads 5 on the substrate 2. Alternatively, another conductive layer forming method such as a vapor deposition process may be used to form the conductive layer on the substrate 2. In the above-described production method, the sputtering process is used to form the isolating layer 6 of silicon dioxide on the lead wires 4. Alternatively, another isolating layer forming method such as an electron beam deposition process or a chemical vapor deposition process may be used to form the isolating layer 6. In addition, the isolating layer 6 is made of silicon dioxide ($SiO_2$) in the above-described embodiment, but another isolating material such as $Si_3N_4$ may be used instead. Further, in the above-described production method, wet etching is used for etching of the isolating layer 6. If an etching of the substrate 2 is performed, it is necessary to protect the bottom surface of the substrate 2 from the etchant by a resist when such an etching is performed.

In the above-described embodiment of FIG. 1B, the conductive shielding layer 7 is provided on the top and sides of the lead wires 4 on the substrate 2, and the magnetic field probe 1 of the present embodiment is effective in preventing the distortion of the magnetic field at the lead wires 4 between the coil 3 and the pads within the probe 1.

FIG. 1C shows a modification of the magnetic field probe 1 of the embodiment of FIG. 1B. In the embodiment of FIG. 1C, the conductive shielding layer 7 is provided both at the upper portion of the lead wires 4 on the substrate 2 and at a corresponding bottom surface of the substrate 2. In the magnetic field probe 1 of this embodiment, the top, sides and bottom of the lead wires 4 are protected by the upper-portion shielding layer 7 and the bottom-surface shielding layer 7, and the magnetic field probe 1 of this embodiment is more effective in preventing distortion of the magnetic field at the lead wires 4.

FIG. 1D shows another modification of the magnetic field probe 1 of the embodiment of FIG. 1B. In the embodiment of FIG. 1D, the conductive shielding layer 7 is provided both on the top and sides of the lead wires 4 on the substrate 2 and on a corresponding bottom surface of the lead wires 4 on the substrate 2, and the isolating layer 6 is provided both on the top and sides of the lead wires 4 and at a corresponding bottom surface of the lead wires 4 on the conductive shielding layer 7. In the magnetic field probe 1 of this embodiment, the top, sides and bottom of the lead wires 4 on the substrate 2 are protected by the upper-portion isolating layer 6 and shielding layer 7 and the bottom-portion isolating layer 6 and shielding layer 7, and the magnetic field probe 1 of this embodiment is much more effective in preventing the distortion of the magnetic field at the lead wires 4.

Figure 2:
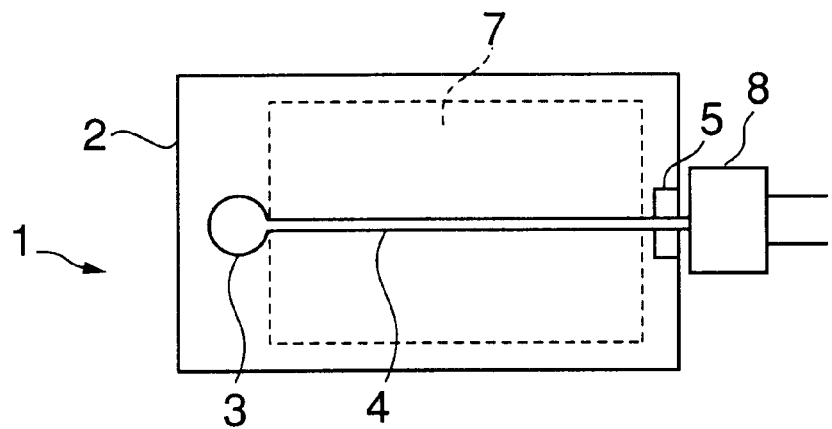
FIG. 2 is a view of another embodiment of the magnetic field probe of the present invention.

FIG. 2 shows another embodiment of the magnetic field probe of the present invention. FIG. 2 is a top view of the magnetic field probe 1 of the present embodiment.

As shown in FIG. 2, the magnetic field probe 1 of the present embodiment generally has the substrate 2, the coil 3, the lead wires 4, the pads 5, the isolating layer 6, and the shielding layer 7 which are the same as the elements of the magnetic field probe of FIG. 1A. Further, in the magnetic-field probe 1 of this embodiment, an impedance transformer 8 is connected to the pads 6. In the impedance transformer 8, a winding is formed by covered wires and a core is formed by a ferrite material. The impedance transformer 8 provides matching of impedance of the probe 1 for a magnetic field measuring system (not shown). If the magnetic field measuring system such as a spectrum analyzer is connected to the pads 5 of the probe 1 through the impedance transformer 8, a magnetic field signal from the probe 1 within a radio frequency range is transmitted to the magnetic field measuring system, so that accurate measurement of the magnetic field signal within the radio frequency range can be performed with the matching of impedance by the impedance transformer 8.

Figure 3:
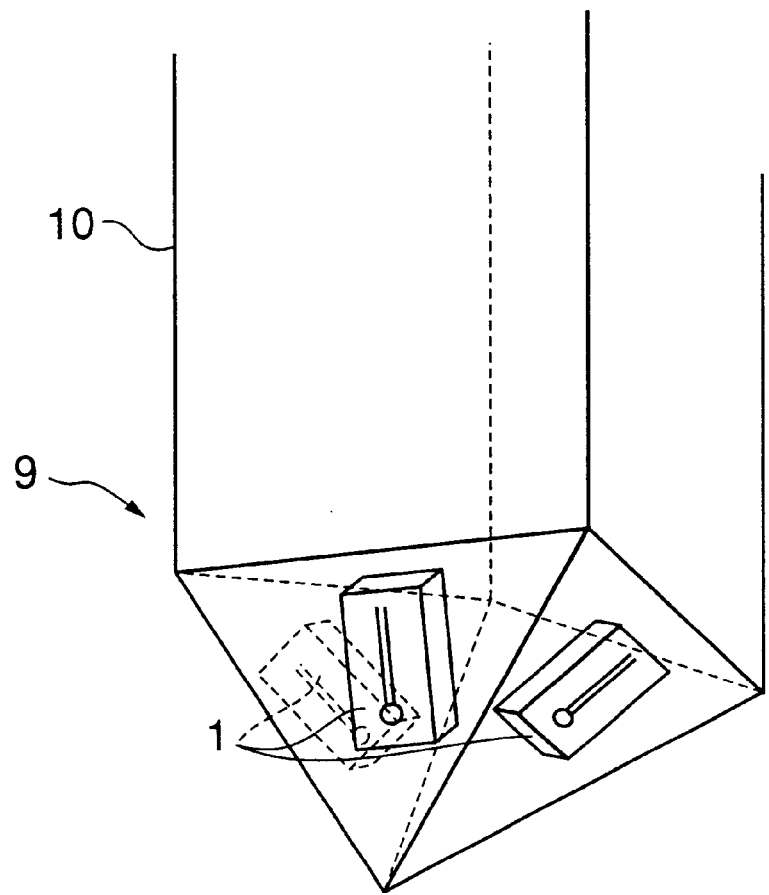
FIG. 3 is a view of a probe unit in which plural magnetic field probes of FIG. 1A are provided.

FIG. 3 shows a probe unit 9 in which plural magnetic field probes of FIG. 1A are provided. FIG. 3 is a perspective view of the probe unit 9 of the present embodiment.

As shown in FIG. 3, the probe unit 9 of the present embodiment generally has the plural magnetic field probes 1 shown in FIG. 1A and a probe supporting rod 10. Each of the magnetic field probes 1 has a construction that is essentially the same as the construction of the magnetic field probe 1 of FIG. 1A. The probe supporting rod 10 has a plurality of (or at least two) end surfaces at a measurement portion of the probe unit 9. Each of the probes 1 is placed on one of the end surfaces of the probe supporting rod 10 at the measurement portion of the probe unit 9.

The end surfaces of the probe supporting rod 10 on which the probes 1 are provided face to specified directions which are different from a longitudinal axial direction of the probe supporting rod 10. If a spectrum analyzer or the like is connected to the pads 5 of the probes 1 on the probe unit 9 via coaxial cables or the like, a magnetic field signal from each probe 1 is transmitted to the spectrum analyzer via the coaxial cables, so that a three-dimensional measurement or vector measurement of the magnetic field from the device under test (DUT) can be performed with high accuracy. The probe unit 9 of the present embodiment forms a magnetic field measuring system of the present invention.

In the above-described embodiment of FIG. 3, the plural magnetic field probes 1 of FIG. 1A are provided. Alternatively, plural magnetic field probes 1 of FIG. 2 may be provided on the end surfaces of the probe supporting rod 10 to form the probe unit 9 of FIG. 3.

Figure 4:
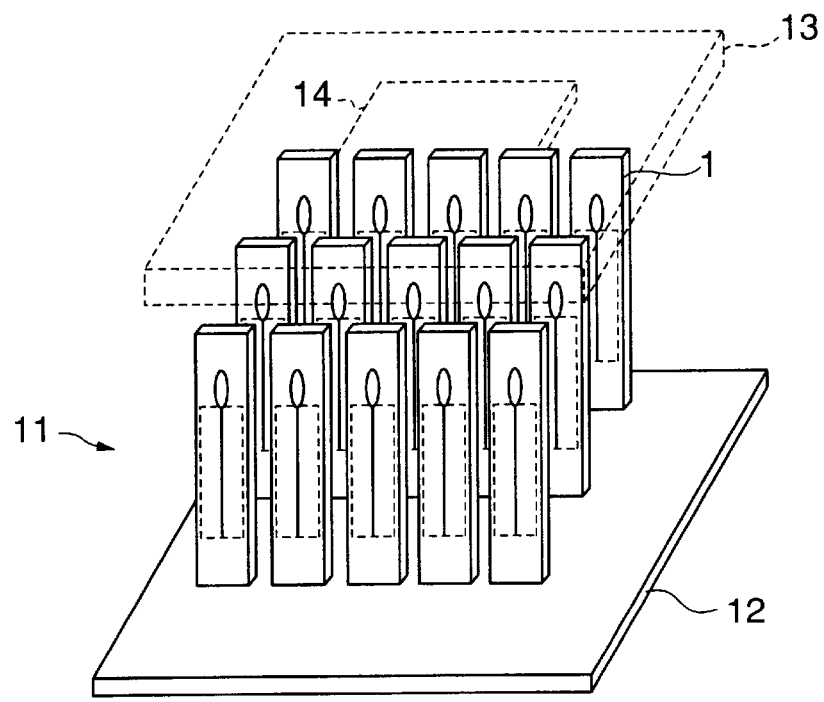
FIG. 4 is a view of a probe array in which an array of magnetic field probes shown in FIG. 1A are provided.

FIG. 4 shows a probe array 11 in which an array of magnetic field probes shown in FIG. 1A are provided. FIG. 4 is a perspective view of the probe array 11 of the present embodiment.

As shown in FIG. 4, the probe array 11 of the present embodiment generally has the plural magnetic field probes 1 of FIG. 1A and a probe supporting board 12. The magnetic field probes 1 which have a construction that is essentially the same as the construction shown in FIG. 1A are orderly arranged in rows and columns in a two-dimensional manner on the probe supporting board 12. Each of the probes 1 is placed at one of the two-dimensional positions on the probe supporting board 12 to form one of the measurement points of the probe array 11.

As indicated by dotted lines in FIG. 4, a device under test (DUT) 14 is placed on a DUT supporting board 13, and the DUT supporting board 13 is provided at an upper portion of the probe array 11. If a spectrum analyzer or the like is connected to the pads 5 of the probes 1 on the probe array 11 via coaxial cables or the like, a magnetic field signal from each probe 1 is transmitted to the spectrum analyzer via the coaxial cables, so that a measurement of the magnetic field from the device under test (DUT) can be performed with high accuracy. In the probe array 11, the probes 1 are orderly arranged on the probe supporting board 12 in rows and columns in a two-dimensional manner, and it is possible to measure a distribution of the magnetic field from the DUT with high accuracy. The probe array 11 of FIG. 4 forms a magnetic field measuring system of the present invention.

In the above-described embodiment of FIG. 4, the plural magnetic field probes 1 of FIG. 1A are provided. Alternatively, a plurality of magnetic field probes 1 of FIG. 2 or a plurality of probe units 9 of FIG. 3 may be provided on the probe supporting board 12 to form the probe array 11 of FIG. 4.

Figure 5:
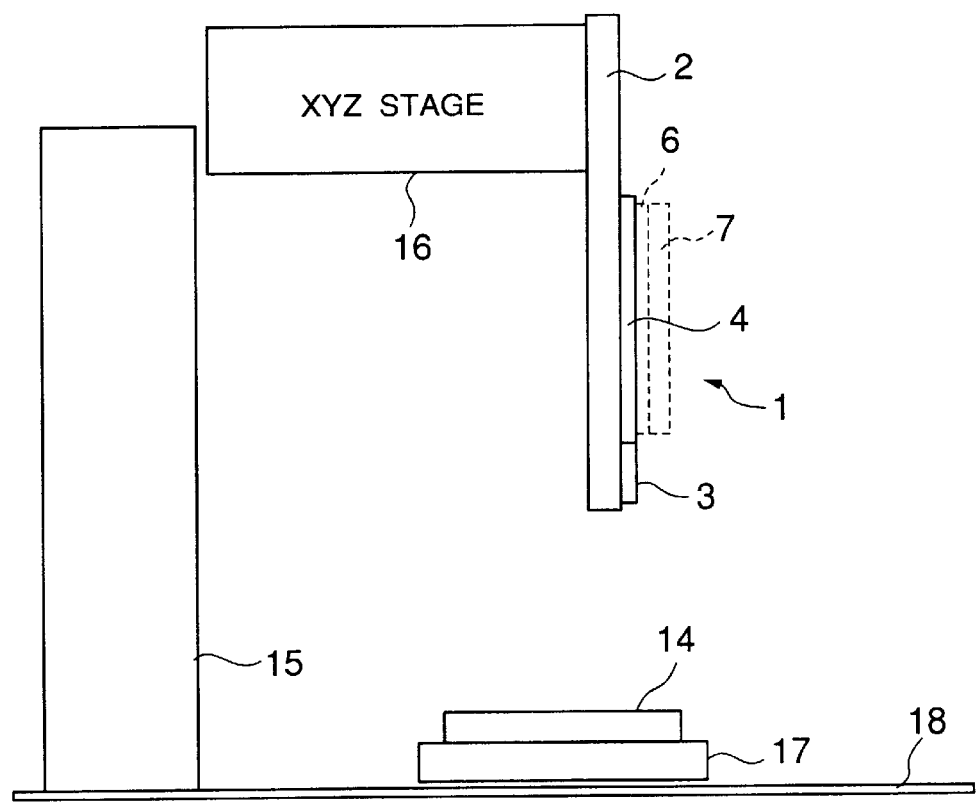
FIG. 5 is a diagram for explaining a construction of a magnetic field measuring system in which the probe of FIG. 1A is provided.

FIG. 5 shows a construction of a magnetic field measuring system in which the probe of FIG. 1A is provided.

As shown in FIG. 5, in the magnetic field measuring system of the present embodiment, the probe 1 of FIG. 1A is attached to an XYZ stage 16. The XYZ stage 16 moves the probe 1 to a specified point relative to the DUT 14 in a three-dimensional manner. A supporting member 15 is fixed to a base 18, and the XYZ stage 16 is supported on the supporting member 15. The DUT 14 is positioned and fixed to a DUT supporting board 17, and the DUT supporting board 17 is fixed to the base 18.

The magnetic field measuring system of FIG. 5 is connected to the pads 5 of the probe 1 on the XYZ stage 16 via the coaxial cable or the like. Before detecting a magnetic field from the DUT 14 in the vicinity of the probe 1, the XYZ stage 16 moves the probe 1 to a specified point with respect to the DUT 14 in a three-dimensional manner. The movement of the probe 1 to the specified point can be performed with high accuracy by the XYZ stage 16. A magnetic field signal from the probe 1 is transmitted to the magnetic field measuring system via the coaxial cable, so that a measurement of the magnetic field from the DUT 14 when the probe 1 is placed at a specified point with respect to the DUT 14 can be performed with high accuracy. Therefore, a distribution measurement of the magnetic field from the DUT 14 can be performed by the magnetic field measuring system of FIG. 5 with high accuracy.

In the above-described embodiment of FIG. 5, the probe 1 of FIG. 1A is attached to the XYZ stage 16 to form the magnetic field measuring system. Alternatively, the probe 1 of FIG. 2 or the probe unit 9 of FIG. 3 may be attached to the XYZ stage 16 to form the magnetic field measuring system of FIG. 5.

Figure 6:
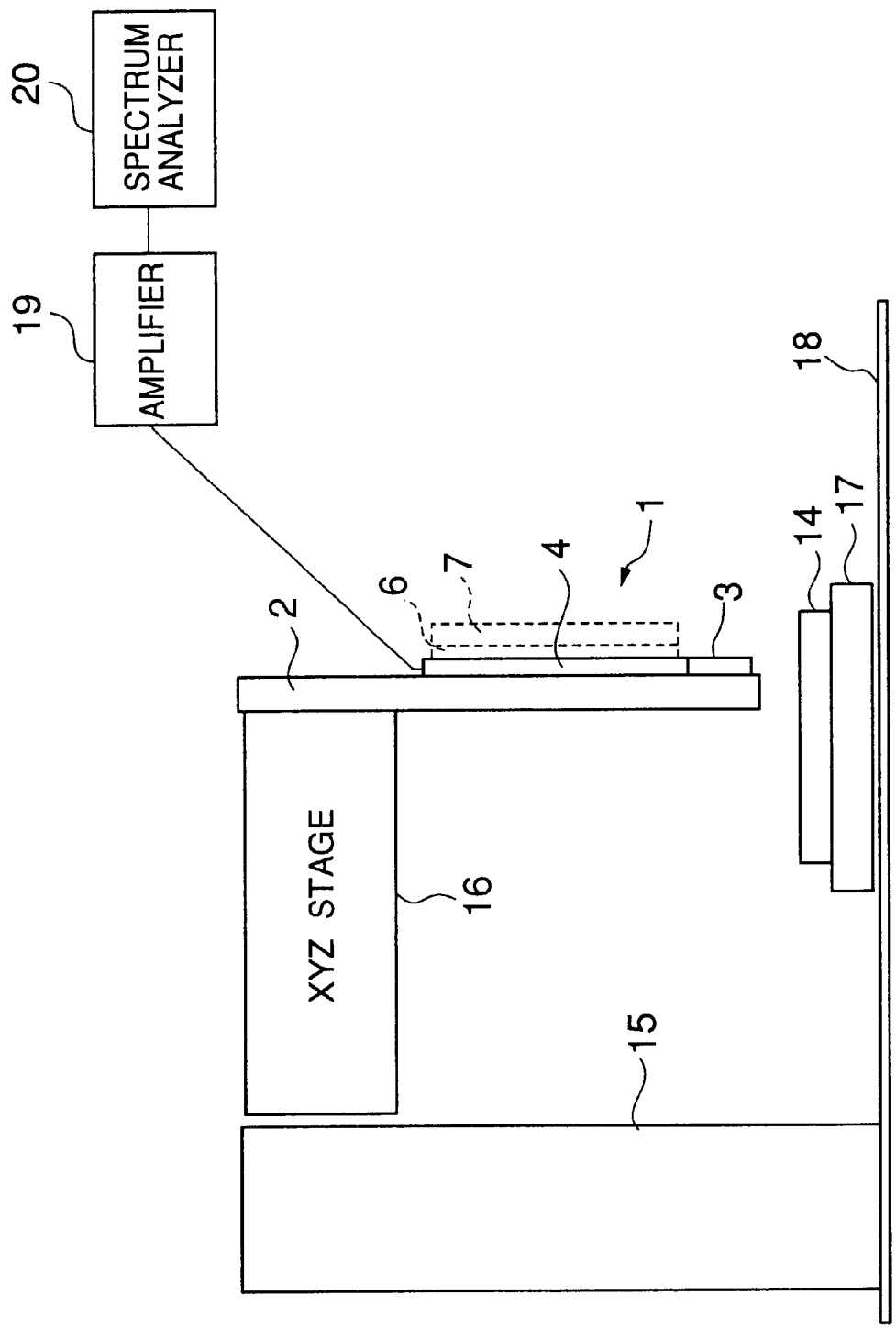
FIG. 6 is a diagram for explaining a construction of another magnetic field measuring system in which the probe of FIG. 1A is provided.

FIG. 6 shows a construction of another magnetic field measuring-system in which the probe of FIG. 1A is provided.

As shown in FIG. 6, in the magnetic field measuring system of the present embodiment, the probe 1 of FIG. 1A is attached to the XYZ stage 16 similar to the embodiment of FIG. 5, and an amplifier 19 is connected at its inputs to the pads 5 of the probe 1. The amplifier 19 provides amplification of a magnetic field signal output by the coil 3 of the probe 1. An output of the amplifier 19 is connected to a spectrum analyzer 20. The spectrum analyzer 20 provides a detection of the magnetic field based on an amplified magnetic field signal output by the amplifier 19 so that a magnetic field measurement for the DUT 14 is performed based on the detection of the magnetic field. The spectrum analyzer 20 forms a magnetic field detecting unit in the magnetic field measuring system of the present invention.

Other elements of the magnetic field measuring system of FIG. 6 have a construction that is essentially the same as the construction of corresponding elements of the embodiment of FIG. 5, and a duplicate description thereof will be omitted.

In the above-described embodiment of FIG. 6, before detecting a magnetic field from the DUT 14 in the vicinity of the probe 1, the XYZ stage 16 moves the probe 1 to a specified point with respect to the DUT 14 in a three-dimensional manner. The movement of the probe 1 to the specified point can be performed with high accuracy by the XYZ stage 16. A magnetic field signal from the probe 1 is transmitted to the magnetic field measuring system via the coaxial cable, so that a measurement of the magnetic field from the DUT 14 at each specified point for the probe 1 can be performed with high accuracy. Therefore, a distribution measurement of the magnetic field from the DUT 14 can be performed by the magnetic field measuring system of FIG. 6 with high accuracy. Further, in the above-described embodiment, the amplifier 19 provides adequate amplification of the magnetic field signal from the DUT 14, and it is possible for the magnetic field measuring system of FIG. 6 to perform accurate detection of a small magnetic field from the DUT.

In the above-described embodiment of FIG. 6, the probe 1 of FIG. 1A is attached to the XYZ stage 16 to form the magnetic field measuring system. Alternatively, the probe 1 of FIG. 2 or the probe unit 9 of FIG. 3 may be attached to the XYZ stage 16 to form the magnetic field measuring system of FIG. 6.

Figure 7:
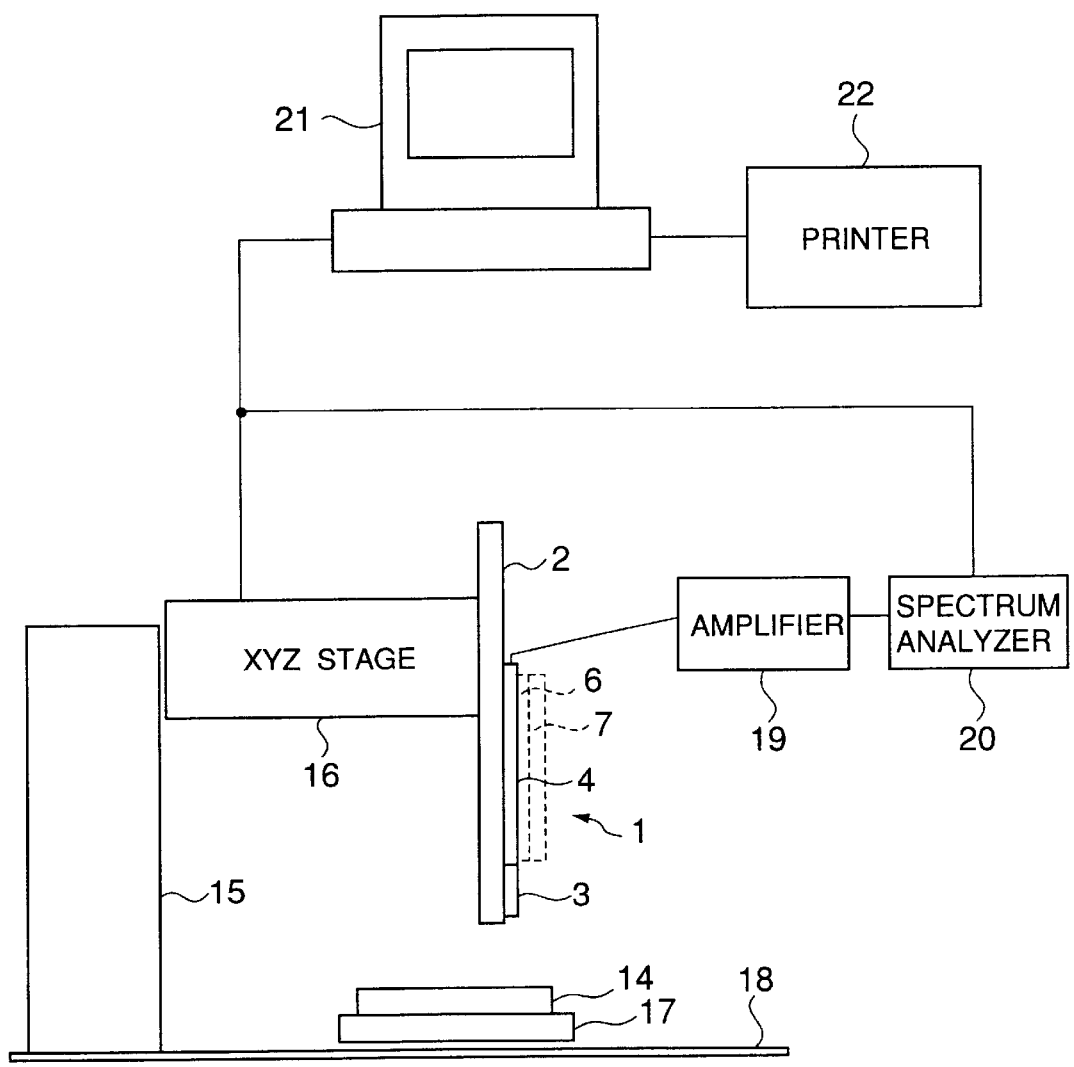
FIG. 7 is a diagram for explaining a construction of a further magnetic field measuring system in which the probe of FIG. 1A is provided.

FIG. 7 shows a construction of a further magnetic field measuring system in which the probe of FIG. 1A is provided.

As shown in FIG. 7, in the magnetic field measuring system of the present embodiment, a data processing device 21 (for example, a personal computer) is connected to each of the XYZ stage 16 and the spectrum analyzer 20 in the embodiment of FIG. 6. More specifically, the probe 1 of FIG. 1A is attached to the XYZ stage 16, and the amplifier 19 is connected at its inputs to the pads 5 of the probe 1 similar to the embodiment of FIG. 6. An input and an output of the XYZ stage 16 is connected to the data processing device 21. An output of the amplifier 19 is connected to the spectrum analyzer 20. An output of the spectrum analyzer 20 is connected to the data processing device 21. The data processing device 21 provides execution of processing of magnetic field measurement data output by the spectrum analyzer 20, and at the same time provides execution of processing of positional data of the probe 1 output by the XYZ stage 16. Also, a printer 22 is connected to the data processing device 21.

Other elements of the magnetic field measuring system of FIG. 7 have a construction that is essentially the same as the construction of corresponding elements of the embodiment of FIG. 6, and a duplicate description thereof will be omitted.

Figure 8:
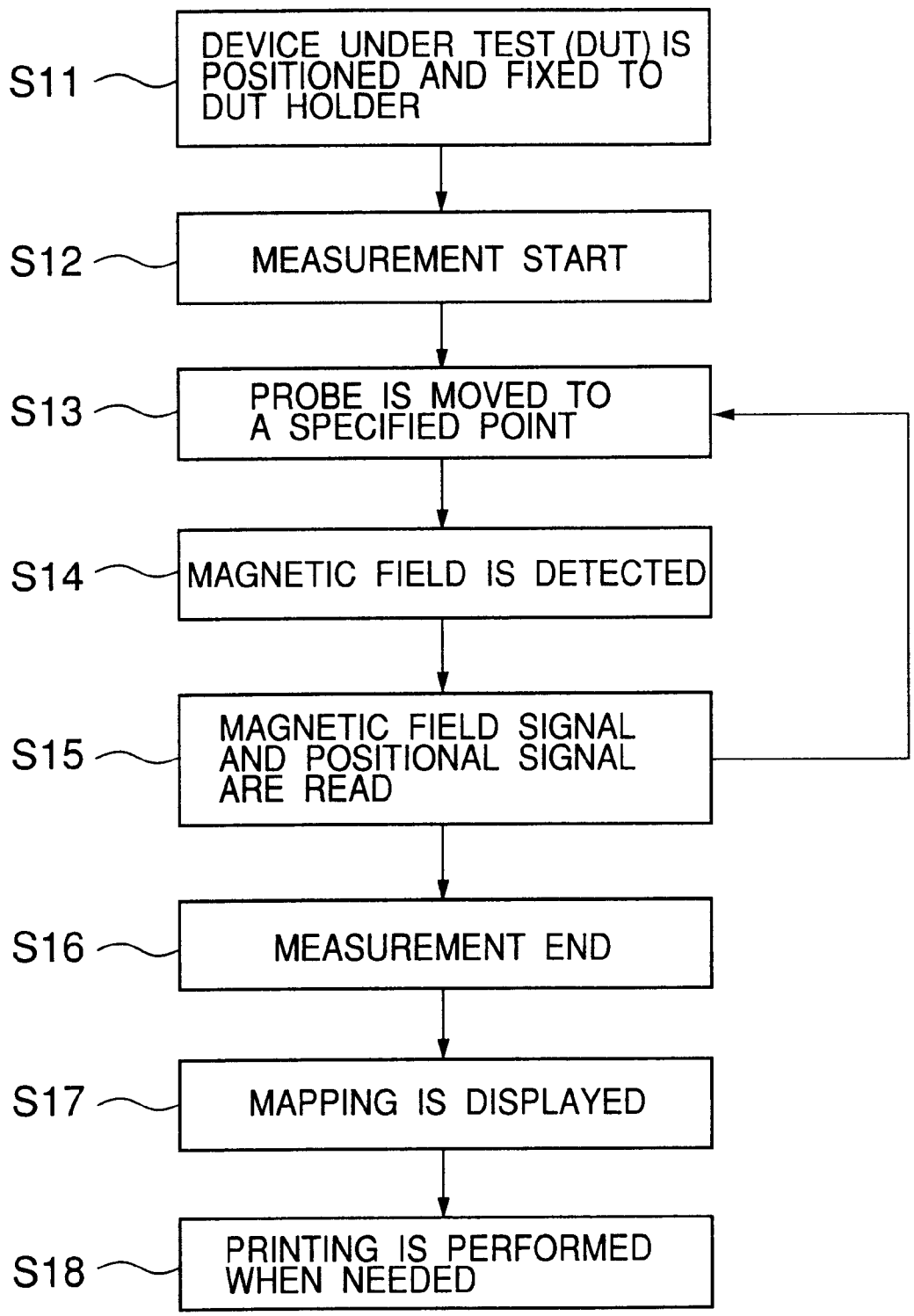
FIG. 8 is a flowchart for explaining a measurement procedure performed with the magnetic field measuring system of FIG. 7.

FIG. 8 shows a measurement procedure performed with the magnetic field measuring system of FIG. 7. As shown in FIG. 8, in the magnetic field measuring system of FIG. 7, before a magnetic field measurement is started, the device under test (DUT) 14 is positioned and fixed to the DUT supporting board 17, and the DUT supporting board 17 is fixed to the base 18 (S11, S12). Before detecting a magnetic field of the DUT 14 in the vicinity of the probe 1, the XYZ stage 16 moves the probe 1 to a specified point with respect to the DUT 14 in a three-dimensional manner (S13). The movement of the probe 1 to the specified point can be performed with high accuracy by the XYZ stage 16 under control of the data processing device 21. After the probe 1 is moved to the specified point, a magnetic field signal output by the coil 3 of the probe 1 due to the DUT 14 is detected (S14). A positional signal indicating the specified point of the probe 1 as a result of the movement of the probe 1 is transmitted from the XYZ stage 16 to the data processing device 21. A magnetic field signal from the probe 1 at the specified point is transmitted to the data processing device 21 through the spectrum analyzer 29, so that a measurement of the magnetic field from the DUT 14 when the probe 1 is placed at a specified point with respect to the DUT 14 can be performed with high accuracy by the data processing device 21. The data processing device 21 reads the magnetic field signal from the probe 1 and the positional signal from the XYZ stage 16 (S15). The above steps S13–S15 are repeated for each specified point of the movement of the probe 1.

After the magnetic field measurement is finished (S16), the data processing device 21 provides mapping of the measured magnetic field at the specified points for the probe 1 into a distribution of the magnetic field based on the amplitude of the magnetic field signal from the probe 1 (S17). The distribution of the magnetic field from the DUT 14 is displayed on a monitor screen of the data processing device 21. Also, the data processing device 21 controls the printer 22 so that the distribution of the magnetic field is printed out by the printer 22 when needed (S18). Therefore, a distribution measurement of the magnetic field from the DUT 14 can be more easily performed with high accuracy by the magnetic field measuring system of FIG. 7.

In the above-described embodiment of FIG. 7, the probe 1 of FIG. 1A is attached to the XYZ stage 16 to form the magnetic field measuring system similar to the embodiment of FIG. 6. Alternatively, the probe array 1 of FIG. 4 may be attached to the XYZ stage 16, and the amplifier 19, the spectrum analyzer 20 and the data processing device 21 are provided in a similar manner to form the magnetic field measuring system of FIG. 7.

FIG. 9A through FIG. 9F show a production method of a further embodiment of the magnetic field probe of the present invention. FIG. 10A through FIG. 10D show the method of production of the magnetic field probe of the embodiment of FIGS. 9A–9F.

Figure 10A:
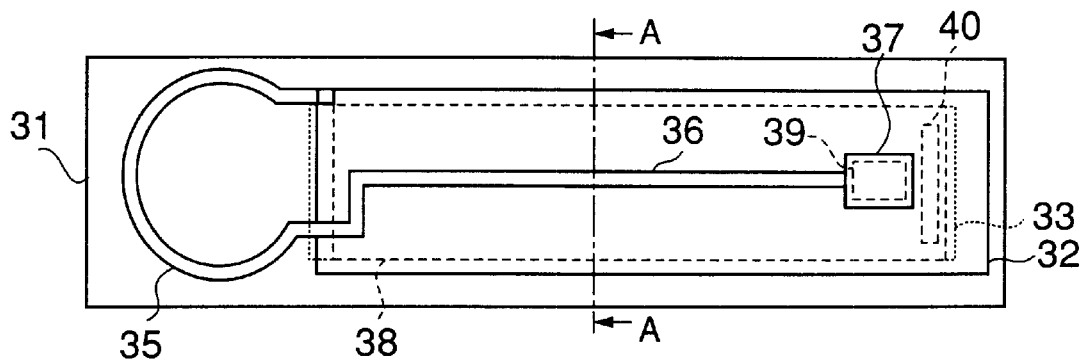
FIG. 10A through FIG. 10D are views of the embodiment of the magnetic field. probe of FIGS. 9A–9F for explaining the method of production thereof.
Figure 10C:
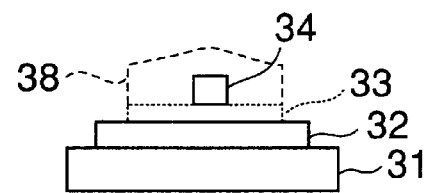
Figure 10B:
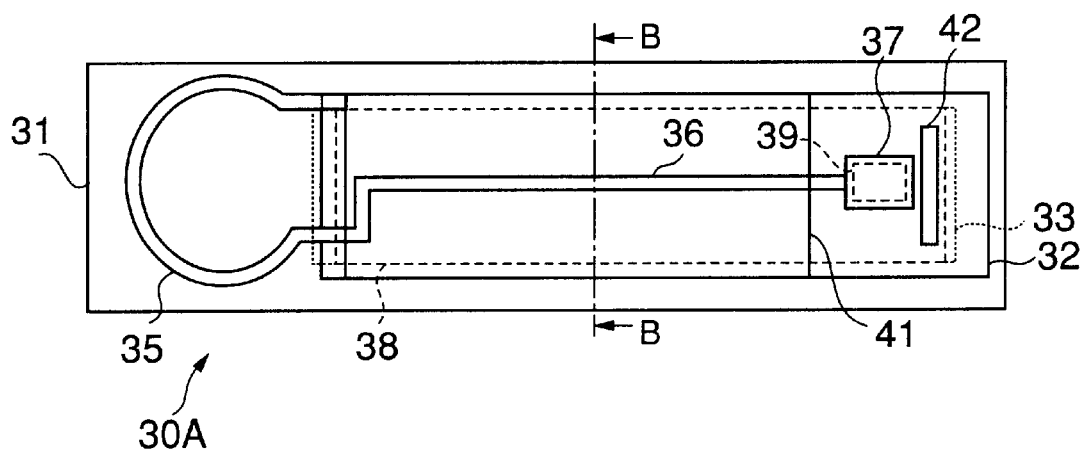
Figure 10D:
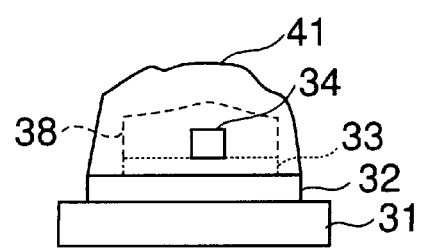

In the present embodiment, the magnetic field probe 30A includes plural conductive layers provided on a substrate, and a coil, lead wires and pads are formed by the conductive layers to establish electrical connections between the coil, the lead wires and the pads as shown in FIG. 10B and FIG. 10D.

As shown in FIG. 10B and FIG. 10D, the magnetic field probe 30A of the present embodiment generally has a substrate 31, and a first conductive layer 32 provided on the substrate 31 to partially cover the substrate 31. The first conductive layer 32 has an external peripheral portion. A first isolating layer 33 is provided on the first conductive layer 32 to overlap with the first conductive layer 32.

In the magnetic field probe 30A, a second conductive layer 34 is provided on the first isolating layer 33, the second conductive layer having a coil 35, an internal conductor 36, and a first pad 37. The coil 35 has a first end connected to the external peripheral portion of the first conductor layer 32 and has a second end connected to the internal conductor 37. The coil 35 outputs a signal indicative of a magnetic field from a device under test (DUT) in the vicinity of the probe 30A. The internal conductor 36 extends from the coil 35 to the first pad 37. The signal from the coil 35 is transmitted to the first pad 37 through the internal conductor 36.

Further, in the magnetic field probe 30A, a second isolating layer 38 is provided on both the first isolating layer 33 and the second conductive layer 34 to overlap with the first isolating layer 33 so that the internal conductor 36 in the second conductive layer 34 is protected by the second isolating layer 38. A third conductive layer 41 is provided on the second isolating layer 38. The third conductive layer 41 is connected to the first conductive layer 32 at positions on both sides of the internal conductor 36 so that the first and the third conductive layers 32 and 41 form a shielding layer to protect the internal conductor 36 in the second conductive layer 34, the shielding layer preventing distortion of the magnetic field at the internal conductor 36 in conjunction with the second isolating layer 38.

In the magnetic field probe 30A of the present embodiment, the third conductive layer 41 has a second pad 42 at a rear end portion of the first conductive layer 32. The second pad 42 is connected to the first end of the coil 35 through the external peripheral portion of the first conductive layer 32.

In order to facilitate understanding of the magnetic field probe 30A of the present embodiment, a description will be given. of a method of production of the magnetic field probe 30A of the present embodiment with reference to FIGS. 9A–9F and 10A–10D.

Figure 9A:
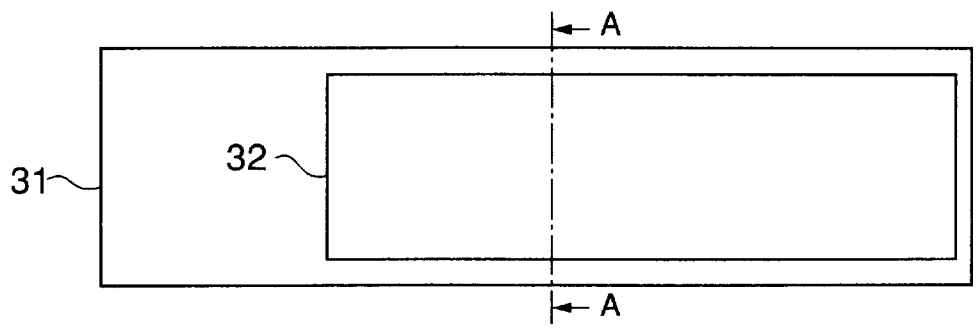
FIG. 9A through FIG. 9F are views of a further embodiment of the magnetic field probe of the present invention for explaining a method of production thereof.
Figure 9D:
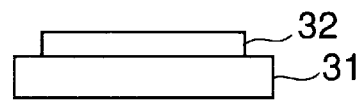

FIG. 9A is a top view of the magnetic field probe of the present embodiment at a first step of the method of production thereof, and FIG. 9D is a cross-sectional view of the magnetic field probe taken along a line A—A in FIG. 9A. The magnetic field probe 30A of the resent embodiment is produced as follows.

First, a thin film of aluminum (Al) is deposited on a substrate 31 of quartz by sputtering. A photolithographic process and a wet etching process are performed so that a first conductive layer 32 is formed on the substrate 31 by the aluminum layer as shown in FIG. 9A and FIG. 9D. In the wet etching process, aqueous solutions of acids, such as $H_3PO_4$, $HNO_3$ and $CH_3COOH$, are used.

Figure 9B:
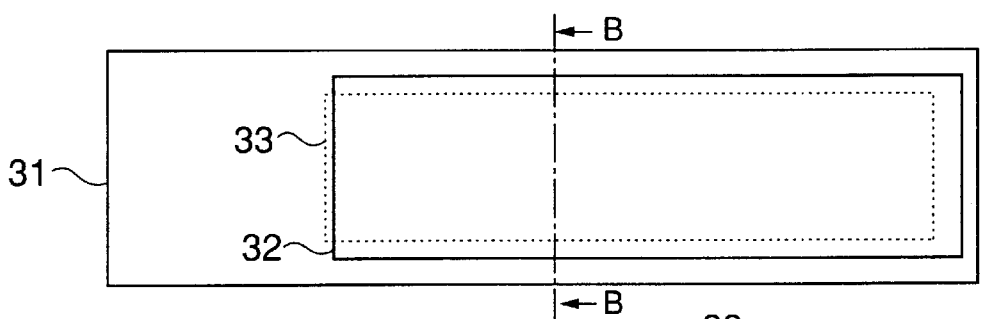
Figure 9E:
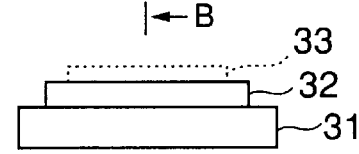

FIG. 9B is a top view of the magnetic field probe of the present embodiment at a second step of the method of production. thereof, and FIG. 9E is a cross-sectional. view of the magnetic field probe taken along a line B—B in FIG. 9B.

Second, a thin film of silicon dioxide ($SiO_2$) is deposited on the first conductive layer 32 by sputtering. A photolithographic process and a reactive ion etching process are performed so that a first isolating layer 33 is formed on the first conductive layer 32 by the silicon dioxide layer as indicated by a dotted line in FIG. 9B. In the reactive ion etching process, $CF_4$ and $H_2$ are used. The first isolating layer 33 is provided substantially within the outer periphery of the first conductive layer 32.

Figure 9C:
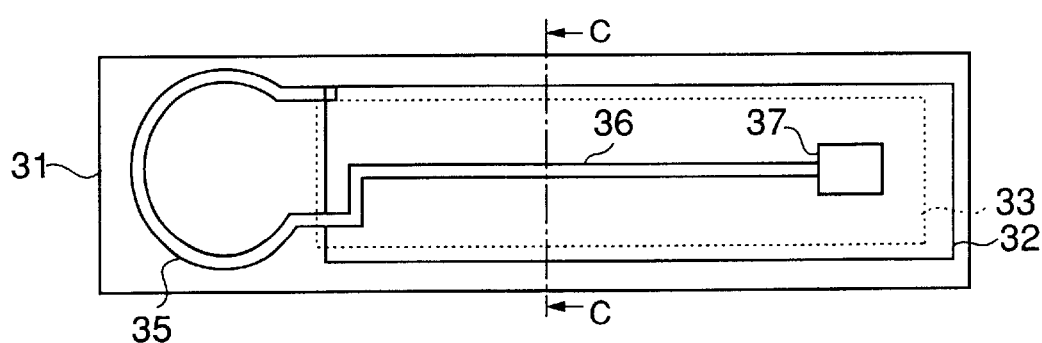
Figure 9F:
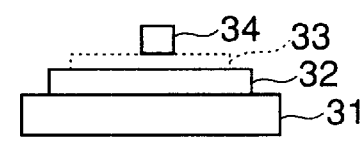

FIG. 9C is a top view of the magnetic field probe of the present embodiment at a third step of the method of production thereof, and FIG. 9F is a cross-sectional view of the magnetic field probe taken along a line C—C in FIG. 9C.

Third, a thin film of aluminum is deposited on the first isolating layer 33 by sputtering, and a photolithographic process and a wet etching process, which are the same as those mentioned above, are performed so that a second conductive layer 34 is formed on the first isolating layer 33 by the aluminum layer as shown in FIG. 9C and FIG. 9F. The second conductive layer 34 includes a coil 35, an internal conductor 36 (which forms one of lead wires from the coil 35), and a first pad 37 extending from the internal conductor 36. The internal conductor 36 and the first pad 37 are provided on the first isolating layer 33, and the coil 35 has one end connected to an outer peripheral portion of the first conductive layer 32, and has the other end connected to an end portion of the internal conductor 36. The internal conductor 36 is connected at the other end to the first pad 37.

FIG. 10A is a top view of the magnetic field probe of the present embodiment at a fourth step of the method of production thereof, and FIG. 10C is a cross-sectional view of the magnetic field probe taken along a line A—A in FIG. 10A.

Fourth, a thin film of silicon dioxide ($SiO_2$) is deposited on the second conductive layer 34 by sputtering. A photolithographic process and a reactive ion etching process, which are the same as those mentioned above, are performed so that a second isolating layer 38 is formed on the second conductive layer 34 by the silicon dioxide layer as indicated by a dotted line in FIG. 10A. The second isolating layer 38 is provided at a position that is substantially the same as the position of the first isolating layer 33. In the second isolating layer 38, a through hole 39 is provided at an upper portion of the first pad 37, and a through hole 40 is provided at an upper portion of the rear end of the first isolating layer 33. The through hole 39 enables an external conductor to be connected to the first pad 37 inside the second isolating layer 38. One of the lead wires from the coil 35 can be connected to the external conductor via the first pad 37.

FIG. 10B is a top view of the magnetic field probe of the present embodiment at a final step of the method of production thereof, and FIG. 10D is a cross-sectional view of the magnetic field probe taken along a line B—B in FIG. 10B.

Finally, a thin film of aluminum is deposited on the second isolating layer 38 by sputtering, and a photolithographic process and a wet etching process, which are the same as those mentioned above, are performed so that a third conductive layer 41 is formed on the second isolating layer 38 by the aluminum layer as shown in FIG. 10B and FIG. 10D. The third conductive layer 41 is provided to encircle the first and second isolating layers 33 and 38 and the internal conductor 36. The third conductive layer 41 is connected to the outer periphery of the first conductive layer 32. Also, a second pad 42 is formed at the position of the through hole 40 which is located at the upper portion of the rear end of the first isolating layer 33. The through hole 40 enables the second pad 42 to be formed at the above-mentioned position thereof. The other of the lead wires from the coil 35 can be connected to an external conductor via the second pad 42.

As described above, in the magnetic field probe 30A of the present embodiment as shown in FIG. 10B, the top, sides and bottom of the internal conductor 36 (or the second conductive layer 34) are protected by the second and first isolating layers 38 and 33, and the second and first isolating layers 38 and 33 are protected by an external shielding layer which is formed by the third and first conductive layers 41 and 32. Therefore, the magnetic field probe 30A of the present embodiment is effective in preventing distortion of the magnetic field at the internal conductor 36 between the coil 35 and the pads 37 and 42 within the probe 30A, and it is possible to provide adequate accuracy of magnetic field measurement for the device under test.

In the above-described embodiment, the coil 35 is formed by the second conductive layer 34. Alternatively, the coil 35 may be formed by the first and third conductive layers 32 and 41.

FIG. 11A through FIG. 11F show a method of production of another embodiment of the magnetic field probe of the present invention. FIG. 12A through FIG. 12D show the method of production of the magnetic field probe of the embodiment of FIGS. 11A–11F.

Figure 12A:
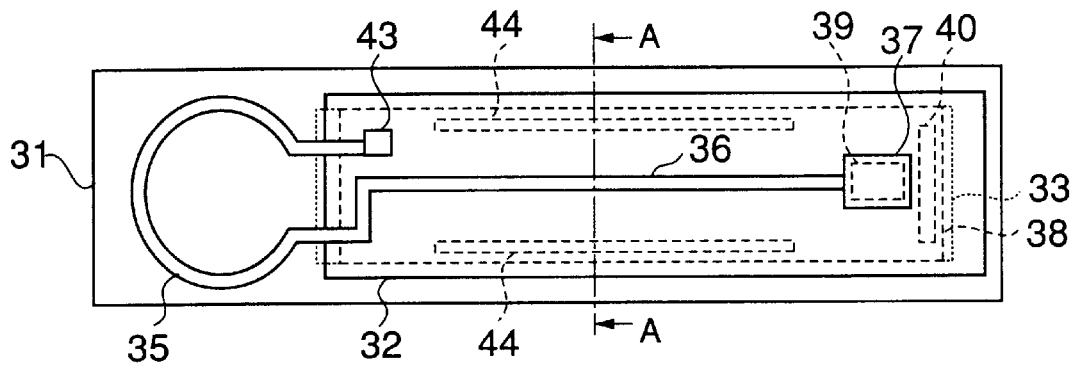
FIG. 12A through FIG. 12D are views of the embodiment of the magnetic field probe of FIGS. 11A–11F for explaining the method of production thereof.
Figure 12C:
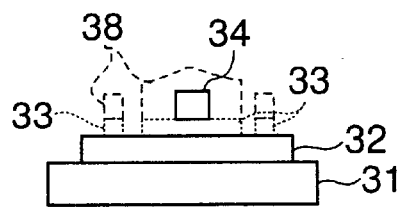
Figure 12B:
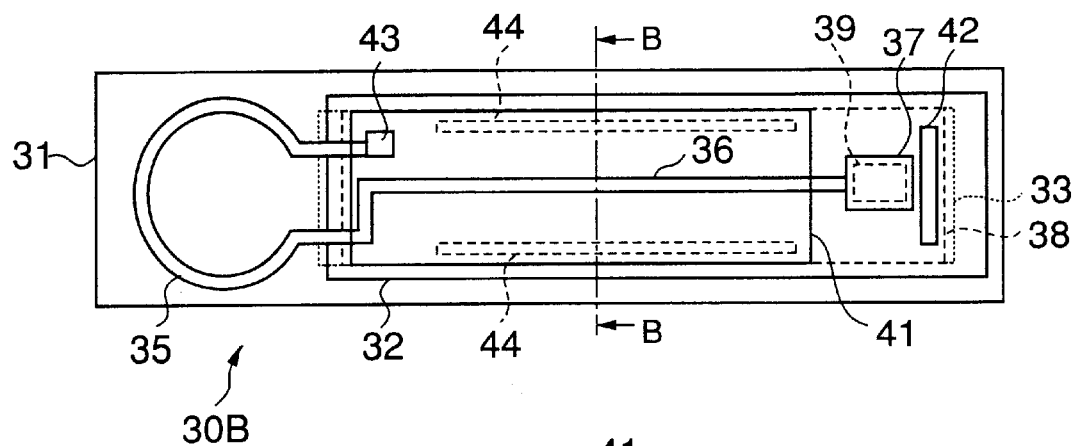

In the present embodiment, the magnetic field probe 30B includes plural conductive layers provided on a substrate, and a coil, lead wires and pads are formed by the conductive layers to establish electrical connections between the coil, the lead wires and the pads as shown in FIG. 12B. In the magnetic field probe 30B of the present embodiment, the elements of the probe 30B are essentially the same as corresponding elements of the probe 30A, but a connection between the coil 35 and the first conductive layer 32 and a connection between the first conductive layer 32 and the third conductive layer 41 in the probe 30B are different from corresponding connections in the probe 30A.

In order to facilitate understanding of the magnetic field probe 30B of the present embodiment, a description will be given of a method of production of the magnetic field probe 30B of the present embodiment with reference to FIGS. 11A–11F and 12A–12D.

Figure 11A:
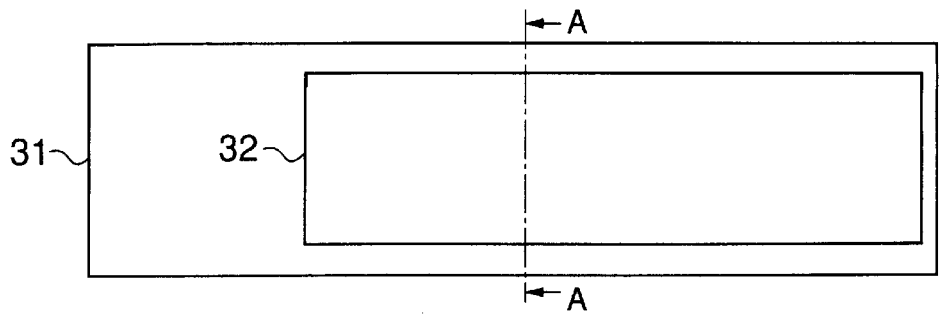
FIG. 11A through FIG. 11F are views of another embodiment of the magnetic field probe of the present invention for explaining a method of production thereof.
Figure 11D:

FIG. 11A is a top view of the magnetic field probe of the present embodiment at a first step of the method of production thereof, and FIG. 11D is a cross-sectional view of the magnetic field probe taken along a line A—A in FIG. 11A. The magnetic field probe 30B of the present embodiment is produced as follows.

First, a thin film of aluminum (Al) is deposited on a substrate 31 of quartz by sputtering. A photolithographic process and a wet etching process are performed so that a first conductive layer 32 is formed on the substrate 31 by the aluminum layer as shown in FIG. 11A and FIG. 11D. The photolithographic process and the wet etching process are the same as those used in the embodiment of FIGS. 9A–9F and 10A–10D.

Figure 11B:
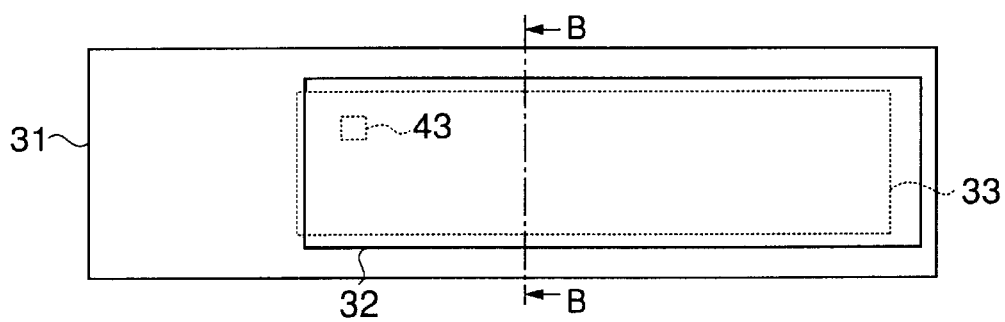
Figure 11E:
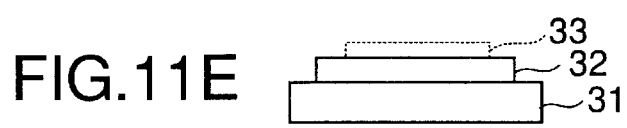

FIG. 11B is a top view of the magnetic field probe of the present embodiment at a second step of the method of production thereof, and FIG. 11E is a cross-sectional view of the magnetic field probe taken along a line B—B in FIG. 11B.

Second, a thin film of silicon dioxide ($SiO_2$) is deposited on the first conductive layer 32 by sputtering. A photolithographic process and a reactive ion etching process are performed so that a first isolating layer 33 is formed on the first conductive layer 32 by the silicon dioxide layer as indicated by a dotted line in FIG. 11B. The first isolating layer 33 is provided substantially within the outer periphery of the first conductive layer 32. Further, a through hole 43 is formed in the first isolating layer 33 as indicated by a dotted line in FIG. 11B. The photolithographic process and the reactive ion etching process are the same as those used in the embodiment of FIGS. 9A–9F and 10A–10D.

Figure 11C:
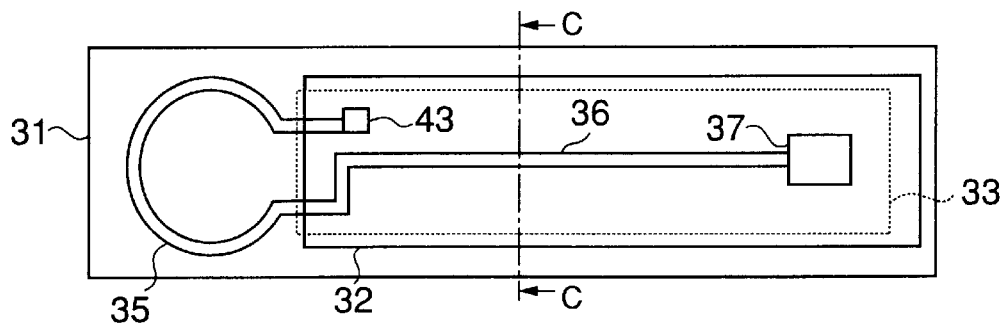
Figure 11F:
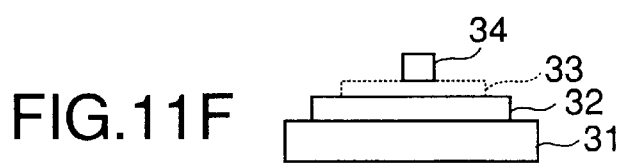

FIG. 11C is a top view of the magnetic field probe of the present embodiment at a third step of the method of production thereof, and FIG. 11F is a cross-sectional view of the magnetic field probe taken along a line C—C in FIG. 1C.

Third, a thin film of aluminum is deposited on the first isolating layer 33 by sputtering, and a photolithographic process and a wet etching process, which are the same as those mentioned above, are performed so that a second conductive layer 34 is formed on the first isolating layer 33 by the aluminum layer as shown in FIG. 11C and FIG. 11F. The second conductive layer 34 includes a coil 35, an internal conductor 36 (which forms one of lead wires from the coil 35), and a first pad 37 extending from the internal conductor 36. The internal conductor 36 and the first pad 37 are provided on the first isolating layer 33, and the coil 35 has one end connected to an outer peripheral portion of the first conductive layer 32 via the through hole 43, and has the other end connected to an end portion of the internal conductor 36. The internal conductor 36 is connected at the other end to the first pad 37.

FIG. 12A is a top view of the magnetic field probe of the present embodiment at a fourth step of the method of production thereof, and FIG. 12C is a cross-sectional view of the magnetic field probe taken along a line A—A in FIG. 12A.

Fourth, a thin film of silicon dioxide ($SiO_2$) is deposited on the first isolating layer 33 and the second conductive layer 34 by sputtering. A photolithographic process and a reactive ion etching process, which are the same as those mentioned above, are performed so that a second isolating layer 38 is formed on the first isolating layer 33 and the second conductive layer 34 by the silicon dioxide layer as indicated by a dotted line in FIG. 12A. Further, two longitudinal through holes 44 are formed in the first and second isolating layers 33 and 38 at positions on both sides of the internal conductor 36 as indicated by dotted lines in FIG. 12A. The second isolating layer 38 is provided at a position that is substantially the same as the position of the first isolating layer 33 except the through holes 44. Further, in the second isolating layer 38, a through hole 39 is provided at an upper portion of the first pad 37, and a through hole 40 is provided at an upper portion of the rear end of the first isolating layer 33. The through hole 39 enables an external conductor to be connected to the first pad 37 inside the second isolating layer 38. One of the lead wires from the coil 35 can be connected to the external conductor via the first pad 37.

Figure 12D:
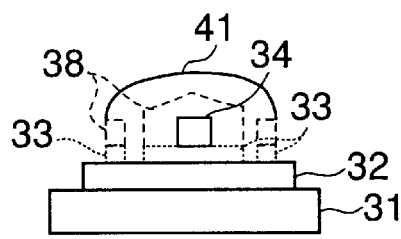

FIG. 12B is a top view of the magnetic field probe of the present embodiment at a final step of the method of production thereof, and FIG. 12D is a cross-sectional view of the magnetic field probe taken along a line B—B in FIG. 12B.

Finally, a thin film of aluminum is deposited on the second isolating layer 38 by sputtering, and a photolithographic process and a wet etching process, which are the same as those mentioned above, are performed so that a third conductive layer 41 is formed on the second isolating layer 38 by the aluminum layer as shown in FIG. 12B and FIG. 12D. The third conductive layer 41 is provided to encircle the first and second isolating layers 33 and 38 and the internal conductor 36. The third conductive layer 41 is connected to the first conductive layer 32 via the through holes 44. Also, a second pad 42 is formed at the position of the through hole 40 which is located at the upper portion of the rear end of the first isolating layer 33. The through hole 40 enables the second pad 42 to be formed at the position thereof. The other of the lead wires from the coil 35 can be connected to an external conductor via the second pad 42.

As described above, in the magnetic field probe 30B of the present embodiment as shown in FIG. 12B, the top, sides and bottom of the internal conductor 36 (or the second conductive layer 34) are protected by the second and first isolating layers 38 and 33, and further the top, sides and bottom of the second and first isolating layers 38 and 33 are protected by an external shielding layer (or the third and first conductive layers 41 and 32). Therefore, the magnetic field probe 30B of the present embodiment is effective in preventing distortion of a magnetic field at the internal conductor 36 between the coil 35 and the pads 37 and 42 within the probe 30B, and it is possible to provide adequate accuracy for magnetic field measurement of the device under test.

In the above-described embodiment, the coil, the lead wires and the pads are made of aluminum (Al). Alternatively, one of other metallic materials such as silver (Ag), gold (Au) and platinum (Pt) may be used to form the coil, the lead wires and the pads on the substrate. In the above-described embodiment, the substrate is made of quartz. Alternatively, one of other isolating substrate materials or flexible isolating substrate materials (such as polyethylene terephthalate and polyimide) may be used to form the substrate.

In the above-described production method, the sputtering process is used to form the conductive layers. Alternatively, another conductive layer forming method such as a vapor deposition process may be used to form the conductive layers. In the above-described production method, the sputtering process is used to form the isolating layers. Alternatively, another isolating layer forming method such as an electron beam deposition process or a chemical vapor deposition process may be used to form the isolating layers.

In addition, the isolating layers are made of silicon dioxide ($SiO_2$) in the above-described embodiment, but another isolating material such as $Si_3N_4$ may be used instead. Further, in the above-described production method, wet etching is used for etching of the conductive layers and the isolating layers. Alternatively, a dry etching process may be used for etching of the conductive layers. If an etching of the substrate is performed when the wet etching process is used for etching the isolating layers, it is necessary to protect the bottom surface of the substrate by a resist when such an etching is performed.

FIG. 13A through FIG. 13F show a method of production of a further embodiment of the magnetic field probe of the present invention. FIG. 14A through FIG. 14D are the method of production of the magnetic field probe of the embodiment of FIGS. 13A–13F.

Figure 14A:
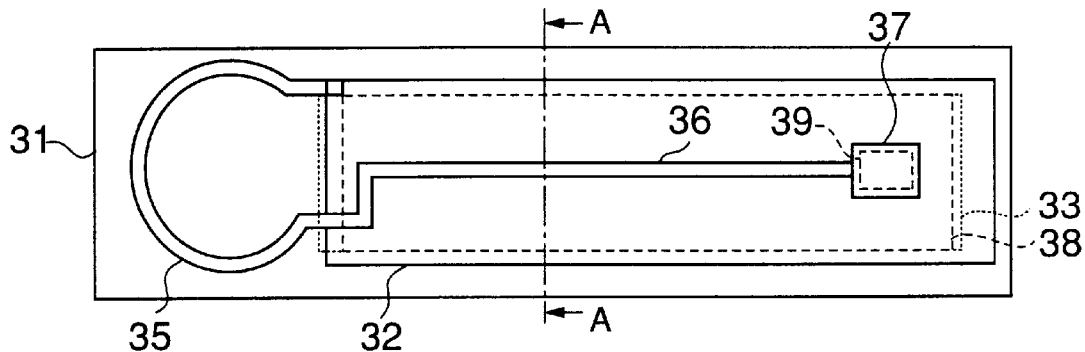
FIG. 14A through FIG. 14D are views of the embodiment of the magnetic field probe of FIGS. 13A–13F for explaining the method of production thereof.
Figure 14C:
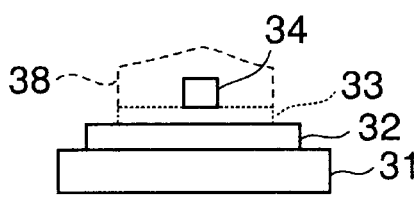
Figure 14B:
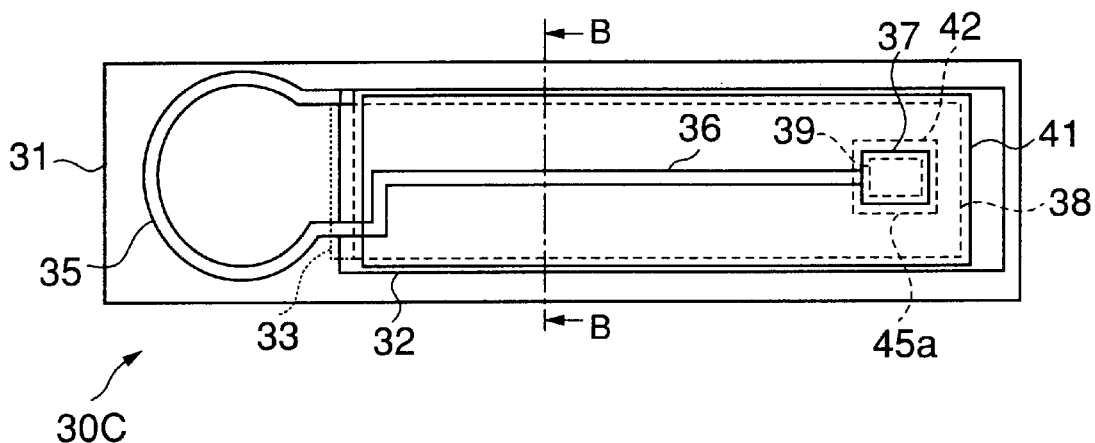

In the present embodiment, the magnetic field probe 30C includes plural conductive layers provided on a substrate, and a coil, lead wires and pads are formed by the conductive layers to establish electrical connections between the coil, the lead wires and the pads as shown in FIG. 14B. In the magnetic field probe 30C of the present embodiment, the elements of the probe 30C are essentially the same as corresponding elements of the probe 30A, but a second pad 42 in the probe 30C is different from the second pad 42 in the probe 30A.

In order to facilitate understanding of the magnetic field probe 30C of the present embodiment, a description will be given of a method of production of the magnetic field probe 30C of the present embodiment with reference to FIGS. 13A–13F and 14A–14D.

Figure 13A:
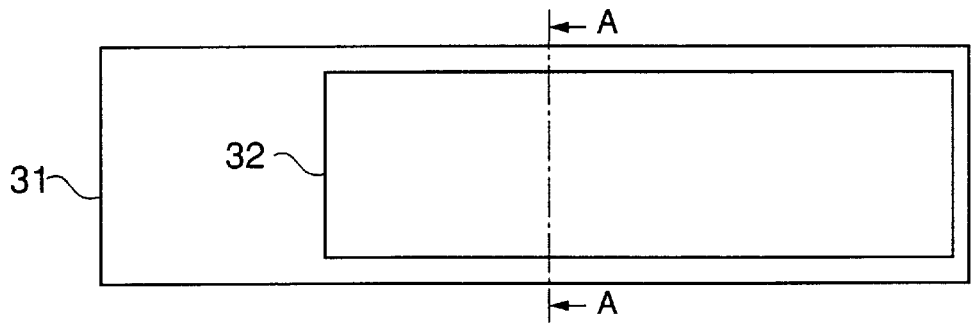
FIG. 13A through FIG. 13F are views of a further embodiment of the magnetic field probe of the present invention for explaining a method of production thereof.
Figure 13D:

FIG. 13A is a top view of the magnetic field probe of the present embodiment at a first step of the method of production thereof, and FIG. 13D is a cross-sectional view of the magnetic field probe taken along a line A—A in FIG. 13A. The magnetic field probe 30C of the present embodiment is produced as follows.

First, a thin film of aluminum (Al) is deposited on a substrate 31 of quartz by sputtering. A photolithographic process and a wet etching process are performed so that a first conductive layer 32 is formed on the substrate 31 by the aluminum layer as shown in FIG. 13A and FIG. 13D. The photolithographic process and the wet etching process are the same as those used in the embodiment of FIGS. 9A–9F and 10A–10D.

Figure 13B:
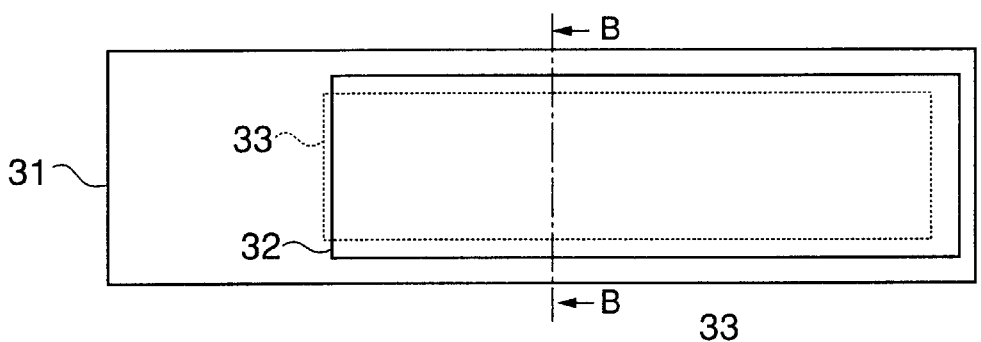
Figure 13E:
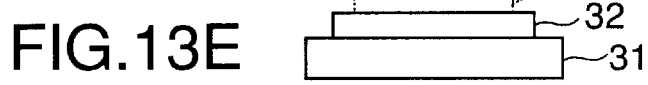

FIG. 13B is a top view of the magnetic field probe of the present embodiment at a second step of the method of production thereof, and FIG. 13E is a cross-sectional view of the magnetic field probe taken along a line B—B in FIG. 13B.

Second, a thin film of silicon dioxide ($SiO_2$) is deposited on the first conductive layer 32 by sputtering. A photolithographic process and a reactive ion etching process are performed so that a first isolating layer 33 is formed on the first conductive layer 32 by the silicon dioxide layer as indicated by a dotted line in FIG. 13B. The first isolating layer 33 is provided substantially within the outer periphery of the first conductive layer 32. The photolithographic process and the reactive ion etching process are the same as those used in the embodiment of FIGS. 9A–9F and 10A–10D.

Figure 13C:
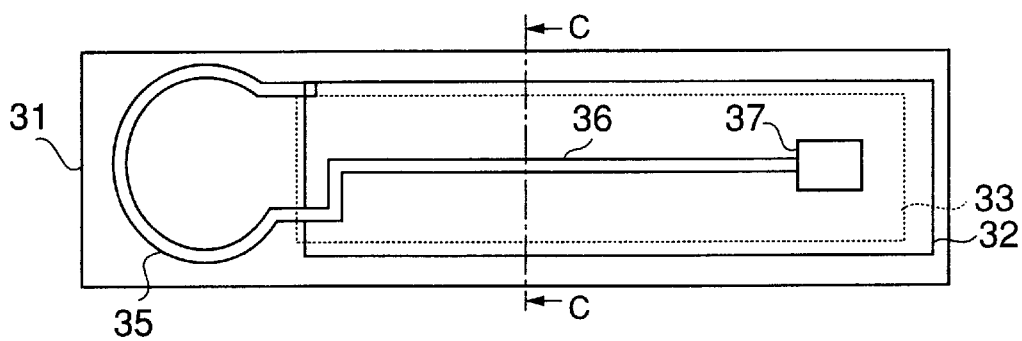
Figure 13F:
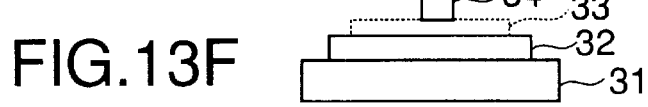

FIG. 13C is a top view of the magnetic field probe of the present embodiment at a third step of the method of production thereof, and FIG. 13F is a cross-sectional view of the magnetic field probe taken along a line C—C in FIG. 13C.

Third, a thin film of aluminum is deposited on the first isolating layer 33 by sputtering, and a photolithographic process and a wet etching process, which are the same as those mentioned above, are performed so that a second conductive layer 34 is formed on the first isolating layer 33 by the aluminum layer as shown in FIG. 13C and FIG. 13F. The second conductive layer 34 includes a coil 35, an internal conductor 36 (which forms one of lead wires from the coil 35), and a first pad 37 extending from the internal conductor 36. The internal conductor 36 and the first pad 37 are provided on the first isolating layer 33, and the coil 35 has one end connected to an outer peripheral portion of the first conductive layer 32, and has the other end connected to an end portion of the internal conductor 36. The internal conductor 36 is connected at the other end to the first pad 37.

FIG. 14A is a top view of the magnetic field probe of the present embodiment at a fourth step of the method of production thereof, and FIG. 14C is a cross-sectional view of the magnetic field probe taken along a line A—A in FIG. 14A.

Fourth, a thin film of silicon dioxide ($SiO_2$) is deposited on the first isolating layer 33 and the second conductive layer 34 by sputtering. A photolithographic process and a reactive ion etching process, which are the same as those mentioned above, are performed so that a second isolating layer 38 is formed on the first isolating layer 33 and the second conductive layer 34 by the silicon dioxide layer as indicated by a dotted line in FIG. 14A. The second isolating layer 38 is provided at a position that is substantially the same as the position of the first isolating layer 33. Further, in the second isolating layer 38, a through hole 39 is provided at an upper portion of the first pad 37. The through hole 39 enables an external conductor to be connected to the first pad 37 inside the second isolating layer 38. One of the lead wires from the coil 35 can be connected to the external conductor via the first pad 37.

Figure 14D:
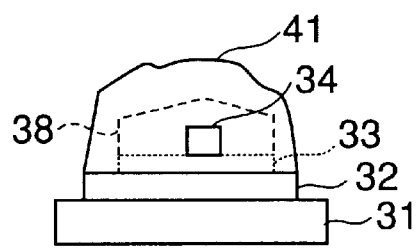

FIG. 14B is a top view of the magnetic field probe of the present embodiment at a final step of the method of production thereof, and FIG. 14D is a cross-sectional view of the magnetic field probe taken along a line B—B in FIG. 14B.

Finally, a thin film of aluminum is deposited on the second isolating layer 38 by sputtering, and a photolithographic process and a wet etching process, which are the same as those mentioned above, are performed so that a third conductive. layer 41 is formed on the second isolating layer 38 by the aluminum layer as shown in FIG. 14B and FIG. 14D. The third conductive layer 41 is provided to encircle the first and second isolating layers 33 and 38 and the internal conductor 36. The third conductive layer 41 is connected to the outer periphery of the first conductive layer 32. In the third conductive layer 41, a rectangular opening 45a which encircles the first pad 37 is formed. The opening 45a serves to avoid electrical connection between the third conductive layer 41 and the first pad 37. A second pad 42 in the present embodiment is formed by a corresponding portion of the third conductive layer 41 around the opening 45a. The other of the lead wires from the coil 35 can be connected to an external conductor (not shown) via the second pad 42.

As described above, in the magnetic field probe 30C of the present embodiment as shown in FIG. 14B, the top, sides and bottom of the internal conductor 36 (or the second conductive layer 34) are protected by the second and first isolating layers 38 and 33, and further the top, sides and bottom of the second and first isolating layers 38 and 33 are protected by an external shielding layer (or the third and first conductive layers 41 and 32). At the same. time, the sides and bottom of the first pad 37 are protected by the second and first isolating layers 38 and 33, and further the top, sides and bottom of the second and first isolating layers 38 and 33 are protected by the external shielding layer (or the third and first conductive layers 41 and 32. Therefore, the magnetic field probe 30C of the present embodiment is more effective in preventing distortion of the magnetic field at the internal conductor 36 between the coil 35 and the pads 37 and 42 within the probe 30C, and it is possible to provide adequate accuracy for the magnetic field measurement of the device under test.

In the above-described embodiment, the coil 35 is formed by the second conductive layer 34. Alternatively, the coil 35 may be formed by the first and third conductive layers 32 and 41.

In the above-described embodiment, after the first and second isolating layers 33 and 38 are formed, two longitudinal through holes 44 may be formed in the first and second isolating layers 33 and 38 at positions on both sides of the internal conductor 36 in a manner similar to the embodiment of FIG. 12A. These through holes 44 serve to allow the third conductive layer 41 to be electrically connected to the first conductive layer 32 at the positions of the through holes 44.

In the above-described embodiment, the coil, the lead wires and the pads are made of aluminum (Al). Alternatively, one of other metallic materials such as silver (Ag), gold (Au) and platinum (Pt) may be used to form the coil, the lead wires and the pads on the substrate. In the above-described embodiment, the substrate is made of quartz. Alternatively, one of other isolating substrate materials or flexible isolating substrate materials (such as polyethylene terephthalate and polyimide) may be used to form the substrate.

In the above-described production method, the sputtering process is used to form the conductive layers. Alternatively, another conductive layer forming method such as a vapor deposition process may be used to form the conductive layers. In the above-described production method, the sputtering process is used to form the isolating layers. Alternatively, another isolating layer forming method such as an electron beam deposition process or a chemical vapor deposition process may be used to form the isolating layers. In addition, the isolating layers are made of silicon dioxide ($SiO_2$) in the above-described embodiment, but another isolating material such as $Si_3N_4$ may be used instead. Further, in the above-described production method, the wet etching process is used for etching of the conductive layers and the isolating layers. Alternatively, a dry etching process may be used for etching of the conductive layers. If an etching of the substrate is performed when the wet etching process is used for etching the isolating layers, it is necessary to protect the bottom surface of the substrate by a resist when such an etching is performed.

FIG. 15A through FIG. 15H show a method of production of another embodiment of the magnetic field probe of the present invention.

In the present embodiment, the magnetic field probe 30 includes the probe 30C of FIG. 14B (which, alternatively, may be the probe 30A of FIG. 10B or the probe 30B of FIG. 12B) and a coaxial cable. In the magnetic field probe 30 of the present embodiment, the coaxial cable is electrically connected to the pads of the probe 30C.

In order to facilitate understanding of the magnetic field probe 30 of the present embodiment, a description will be given of a method of production of the magnetic field probe 30 of the present embodiment with reference to FIGS. 15A–15H and 16A–16D.

Figure 15A:
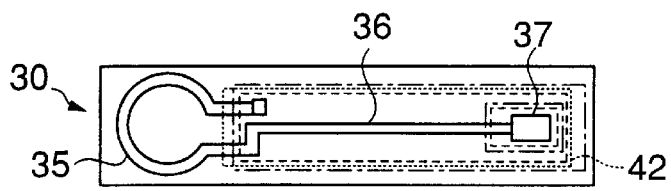
FIG. 15A through FIG. 15H are views of another embodiment of the magnetic field probe of the present invention for explaining a method of production thereof.
Figure 15E:

FIG. 15A is a top view of the magnetic field probe of the present embodiment at a first step of the method of production thereof, and FIG. 15E is a side view of the magnetic field probe of FIG. 15A.

First, a magnetic field probe 30 which is the same as the previous embodiment of FIG. 14B is provided before a coaxial cable is electrically connected to the pads 37 and 42 of the probe 30, as shown in FIG. 15A and FIG. 15E.

Figure 15B:
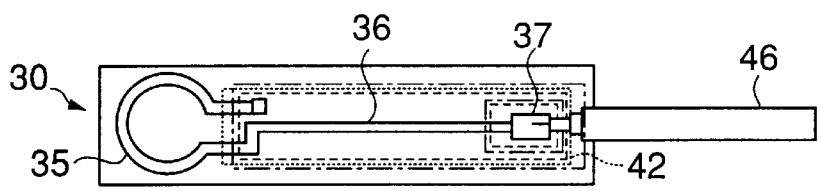
Figure 15F:
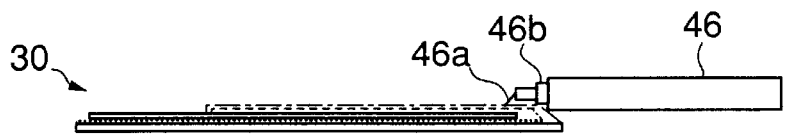

FIG. 15B is a top view of the magnetic field probe of the present embodiment at a second step of the method of production thereof, and FIG. 15F is a side view of the magnetic field probe of FIG. 15B.

Second, a coaxial cable 46 having an internal conductor 46a and an external conductor 46b is connected to the probe 30. Specifically, during the connection procedure for the coaxial cable 46, the internal conductor 46a is connected to the first pad 37 of the probe 30, and the external conductor 46b is connected to the second pad 42 of the probe 30, as shown in FIG. 15B and FIG. 15F.

Figure 15C:
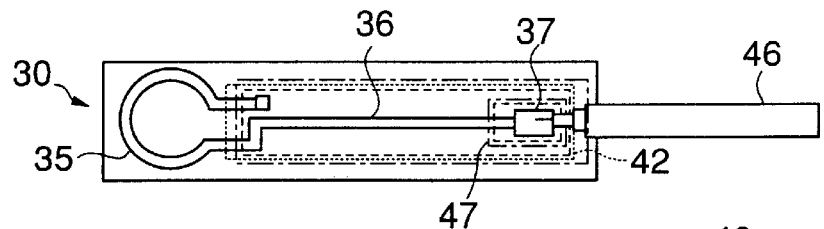
Figure 15G:
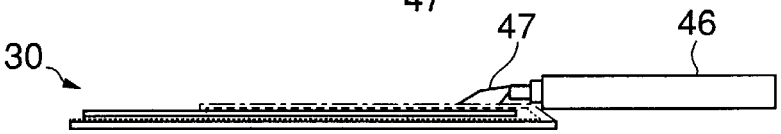

FIG. 15C is a top view of the magnetic field probe of the present embodiment at a third step of the method of production thereof, and FIG. 15G is a side view of the magnetic field probe of FIG. 15C.

Third, an adhesive agent 47 (for example, Araldite) is applied to the connection between the internal conductor 46a and the first pad 37 produced at the second step, so that the adhesive agent 47 forms an isolating layer which fully covers the connection between the internal conductor 46a and the first pad 37 as shown in FIG. 15C and FIG. 15G.

Figure 15D:
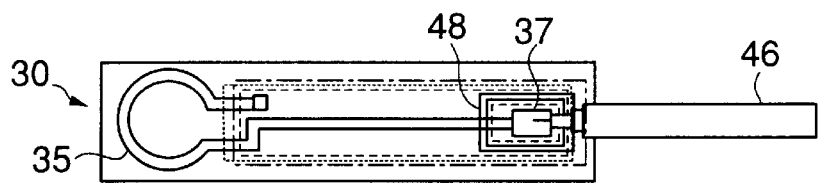
Figure 15H:

FIG. 15D is a top view of the magnetic field probe of the present embodiment at a final step of the method of production thereof, and FIG. 15H is a side view of the magnetic field probe of FIG. 15D.

Finally, the isolating layer of the adhesive agent 47 is protected by a conductive material 48, and the conductive material 48 is integrally attached to the connection between the external conductor 46b and the second pad 42, so that the conductive material 48 fully covers both the connection between the internal conductor 46a and the first pad 37 and the connection between the external conductor 46b and the second pad 42, as shown in FIG. 15D and FIG. 15H. The conductive material 48 is prepared by forming a metallic foil on a flexible film.

As described above, in the magnetic field probe 30 of the present embodiment as shown in FIG. 15D, the top, sides and bottom of the internal conductor 36 (or the second conductive layer 34) are protected by the second and first isolating layers 38 and 33, and further the second and first isolating layers 38 and 33 are protected by the external shielding layer (or the third and first conductive layers 41 and 32). At the same time, the top and sides of the connection between the internal conductor 46a of the coaxial cable 46 and the first pad 37 are protected by the conductive material 48 through the isolating layer of the adhesive agent 47. Therefore, the magnetic field probe 30 of the present embodiment is more effective in preventing distortion of the magnetic field at the internal conductor 36 within the probe 30 and at the connection between the first pad 37 and the coaxial cable 46, and it is possible to provide adequate accuracy for magnetic field measurement of the device under test.

In the above-described embodiment, the connection between the internal conductor 46a and the first pad 37 and the connection between the external conductor 46b and the second pad 42 are protected by using the adhesive agent 47. Alternatively, these connections may be protected by using a conductive adhesive agent or soldering. Further, in the above-described embodiment, the isolating layer is formed by the adhesive agent 47. Alternatively, another isolating material may be used instead.

In the above-described embodiment, the conductive material 48 is used to protect the connection between the internal conductor 46a and the first pad 37 and the connection between the external conductor 46b and the second pad 42. Alternatively, a metallic material may be used instead. FIG. 16A through FIG. 16D show a method of production of such a modification of the magnetic field probe of the embodiment of FIGS. 15A–15H.

Figure 16A:
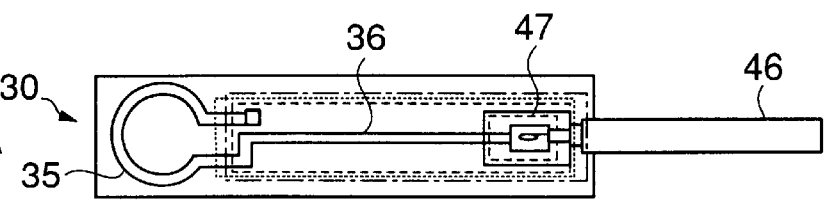
FIG. 16A through FIG. 16D are views of a modification of the magnetic field probe of the embodiment of FIGS. 15A–15H for explaining a method of production thereof.
Figure 16C:

FIG. 16A is a top view of the modification of the magnetic field probe 30 at a first step of the method of production thereof, and FIG. 16C is a side view of the magnetic field probe of FIG. 16A.

First, an adhesive agent 47 of a given adhesive type is applied to the connection between the internal conductor 46a and the first pad 37, so that the adhesive agent 47 forms an isolating layer which fully covers the connection between the internal conductor 46a and the first pad 37 as shown in FIG. 16A and FIG. 16C.

Figure 16B:
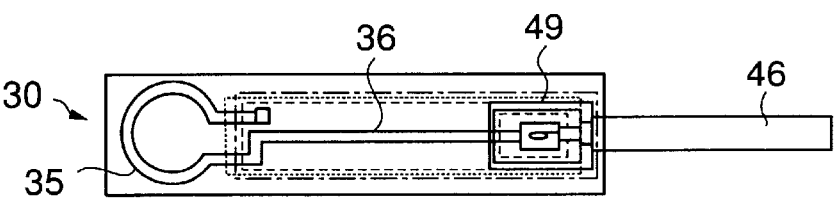
Figure 16D:

FIG. 16B is a top view of the modification of the magnetic field probe 30 at a second step of the method of production thereof, and FIG. 16D is a side view of the magnetic field probe of FIG. 16B.

Second, the isolating layer of the adhesive agent 47 is protected by a metallic material 49, and further the metallic material 49 is attached to the connection between the external conductor 46b and the second pad 42 in a continuous manner, so that the metallic material 49 fully covers both the connection between the internal conductor 46a and the first pad 37 and the connection between the external conductor 46b and the second pad 42, as shown in FIG. 16B and FIG. 16D.

In the above-described embodiment of FIG. 16B, the isolating layer of the adhesive agent 47 is protected by the metallic material 49. Alternatively, a conductive adhesive agent may be used to protect the isolating layer of the adhesive agent 47.

Figure 17:
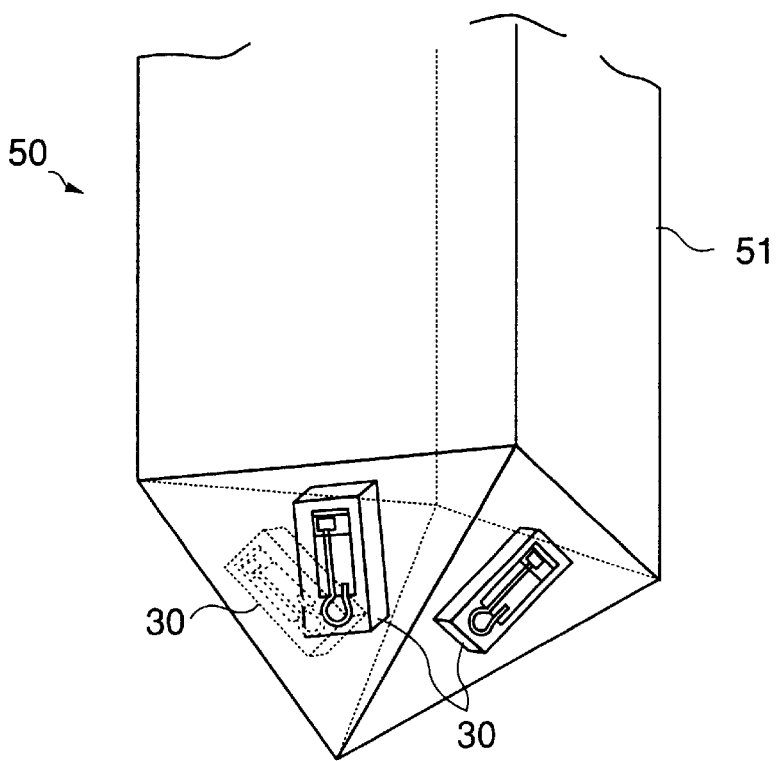
FIG. 17 is a view of a probe unit in which plural magnetic field probes are provided.

FIG. 17 shows a probe unit 50 in which plural magnetic field probes 30 are provided. FIG. 17 is a perspective view of the probe unit 50 of the present embodiment.

As shown in FIG. 17, the probe unit 50 of the present embodiment generally has the plural magnetic field probes 30 (which may have the same construction as one of the probe 30A of FIG. 10B, the probe 30B of FIG. 12B, the probe 30C of FIG. 14B, and the probe 30 of FIG. 15D) and a probe supporting rod 51. Each of the magnetic field probes 30 has a construction that is essentially the same as the construction of one of the probe 30A of FIG. 10B, the probe 30B of FIG. 12B, the probe 30C of FIG. 14B, and the probe 30 of FIG. 15D). The probe supporting rod 51 has a plurality of (or at least two) end surfaces at a measurement portion of the probe unit 50. Each of the probes 30 is placed on one of the end surfaces of the probe supporting rod 51 at the measurement portion of the probe unit 50.

The end surfaces of the probe supporting rod 51 on which the probes 30 are provided face to specified directions which are different from a longitudinal axial direction of the probe supporting rod 51. If a spectrum analyzer or the like is connected to the pads 37 and 42 of the probes 30 on the probe unit 50 via coaxial cables or the like, a magnetic field signal from each probe 30 is transmitted to the spectrum analyzer via the coaxial cables, so that a three-dimensional measurement or vector measurement of the magnetic field from the device under test (DUT) can be performed with high accuracy. The probe unit 50 of the present embodiment forms a magnetic field measuring system of the present invention.

In the above-described embodiment of FIG. 17, in order to carry out an accurate three-dimensional measurement of the magnetic field from the DUT, it is preferred that the probe supporting rod 51 has three end surfaces, and the three end surfaces face to three different directions which are mutually orthogonal. However, even if the end surfaces of the probe supporting rod 51 face to specified directions which are not mutually orthogonal, it is possible to carry out an accurate three-dimensional measurement of the magnetic field of the DUT by performing a correction of the results of detection of magnetic field output by the probes 30 based on the relationship in a direction between the end surfaces of the probe supporting rod 51.

Figure 18:
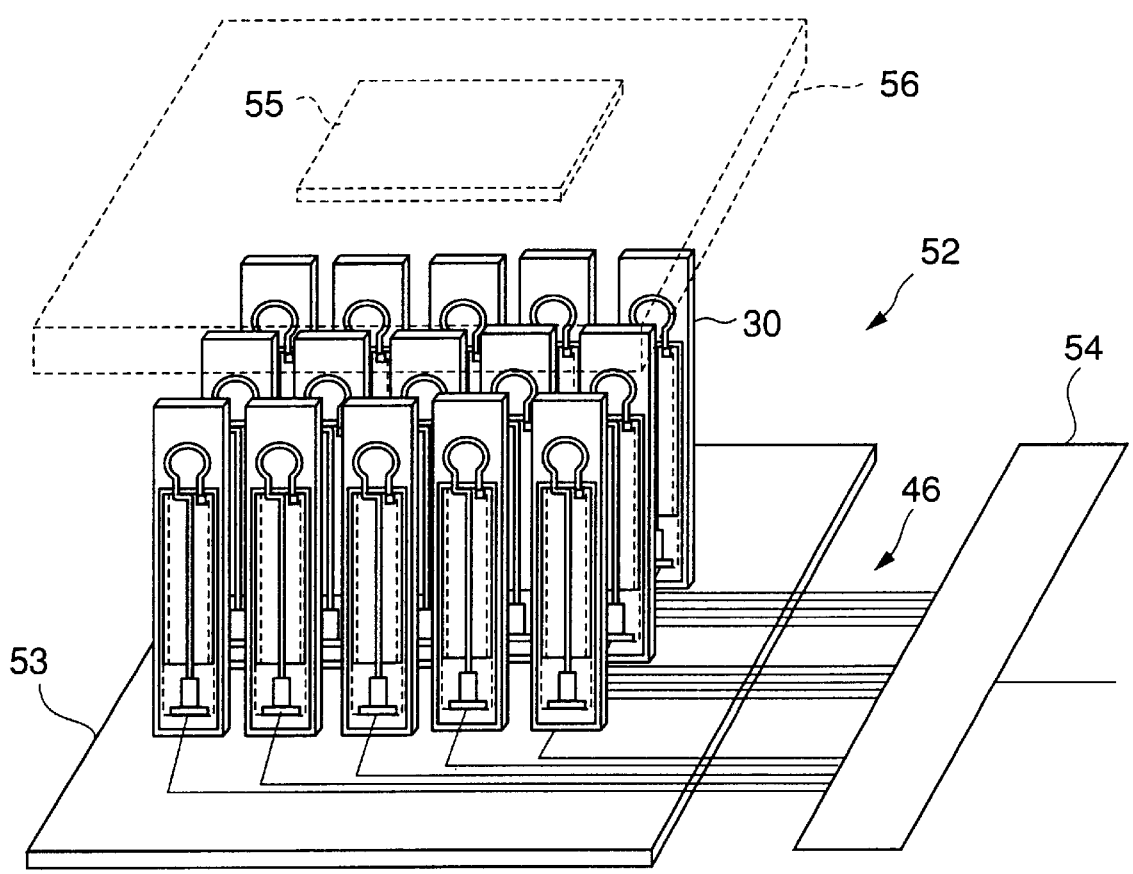
FIG. 18 is a view of a probe array in which an array of magnetic field probes is provided.

FIG. 18 shows a probe array 52 in which an array of magnetic field probes 30 is provided. FIG. 18 is a perspective view of the probe array 52 of the present embodiment.

As shown in FIG. 18, the probe array 52 of the present embodiment generally has an array of magnetic field probes 30 (which may be the same as one of the probe 30A of FIG. 10B, the probe 30B of FIG. 12B, the probe 30C of FIG. 14B, and the probe 30 of FIG. 15D) and a probe supporting board 53. The magnetic field probes 30 which have a construction that is essentially the same as the construction of one of the probe 30A of FIG. 10B, the probe 30B of FIG. 12B, the probe 30C of FIG. 14B, and the probe 30 of FIG. 15D are orderly arranged in rows and columns in a two-dimensional manner on the probe supporting board 53. Each of the probes 30 is placed at one of the two-dimensional positions on the probe supporting board 53 to form one of the measurement points of the probe array 52.

In the probe array 52 of the present embodiment, coaxial cables 46 are connected to the pads 37 and 42 of the probes 30, and the coaxial cables 46 are in turn connected to a switching unit 54.

As indicated by dotted lines in FIG. 18, a device under test (DUT) 55 is supported on a DUT supporting board 56, and the DUT supporting board 56 is provided at an upper portion of the probe array 52.

If a spectrum analyzer (not shown) or the like is connected to the pads 37 and 42 of the probes 30 on the probe array 52 via the switching unit 54, a magnetic field signal from each probe 30 is transmitted to the spectrum analyzer via the switching unit 54, so that a measurement of the magnetic field from the DUT 55 can be performed with high accuracy. In the probe array 52, the probes 30 are orderly arranged on the probe supporting board 53 in rows and columns in a two-dimensional manner, and it is possible to measure a distribution of the magnetic field from the DUT with high accuracy. The probe array 52 of FIG. 18 forms a magnetic field measuring system of the present invention.

In the above-described embodiment of FIG. 18, the probes 30 which are the same as the probe 30A of FIG. 10B are provided. Alternatively, the probes 30 which are the same as one of the probe 30B of FIG. 12B, the probe 30C of FIG. 14B, and the probe 30 of FIG. 15D may be provided on the probe supporting board 53 to form the probe array 52 of FIG. 18.

Figure 19:
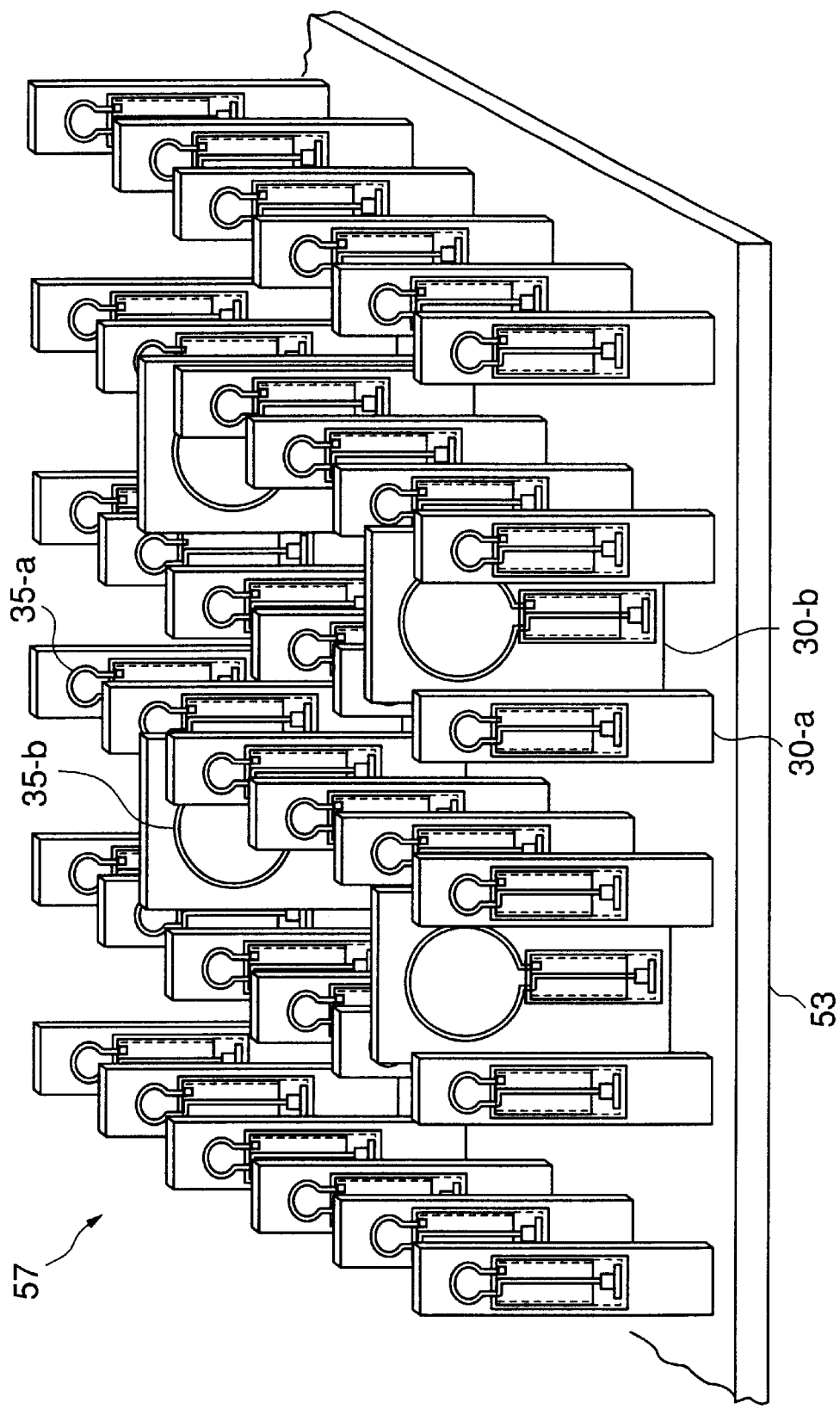
FIG. 19 is a view of another probe array in which an array of large-size-coil probes and an array of small-size-coil probes are provided.

FIG. 19 shows another probe array 57 in which an array of small-size-coil probes and an array of large-size-coil probes are provided. FIG. 19 is a perspective view of the probe array 57 of the present embodiment.

As shown in FIG. 19, the probe array 57 of the present embodiment generally has an array of small-size-coil probes 30-*a*, an array of large-size-coil probes 30-*b*, and the probe supporting board 53. In the probe array 57, the array of small-size-coil probes 30-*a* and the array of large-size-coil probes 30-*b* are provided on the probe supporting board 53. Each of the probes 30-*a* has a small-size coil 35-*a* which is the same as the coil 35 of the probe 30A of FIG. 10B, and each of the probes 30-*b* has a large-size coil 35-*b* which is larger than the small-size coil 35-*a*. The probes 30-*a* having a construction that is the same as the construction of one of the probe 30A of FIG. 10B, the probe 30B of FIG. 12B, the probe 30C of FIG. 14B and the probe 30 of FIG. 15D are orderly arranged in rows and columns in a two-dimensional manner on the probe supporting board 53. Similarly, the probes 30-*b* are orderly arranged in rows and columns in a two-dimensional manner on the probe supporting board 53. Each of the probes 30-*a* is placed at one of the two-dimensional positions on the probe supporting board 53 to form one of measurement points of the probe array 57. Similarly, each of the probes 30-*b* is placed at one of the two-dimensional positions on the probe supporting board 53 to form one of the measurement points of the probe array 57.

In the probe array 57 of the present embodiment, if a spectrum analyzer (not shown) or the like is connected to the pads of the probes 30-*a* and the probes 30-*b* via coaxial cables or the like, a magnetic field signal from each probe is transmitted to the spectrum analyzer via the coaxial cables, so that a measurement of the magnetic field from the DUT can be performed with high accuracy. In the probe array 57, both the probes 30-*a* and the probes 30-*b* are orderly arranged on the probe supporting board 53 in rows and columns in a two-dimensional manner, and it is possible to measure a distribution of the magnetic field from the DUT with high accuracy. When it is desired to quickly detect a portion of the DUT which produces a high magnetic field, a rough measurement of the magnetic field for a wide range of the DUT is first performed by using the large-size-coil probes 30-*b*, and then an exact measurement of magnetic field for a selected range of the DUT is performed by using the small-size-coil probes 30-*a*. Therefore, the probe array 57 of the present embodiment is useful when it is desired to quickly and accurately detect a portion of the DUT which produces a high strength magnetic field. The probe array 57 of FIG. 19 forms a magnetic field measuring system of the present invention.

Figure 20:
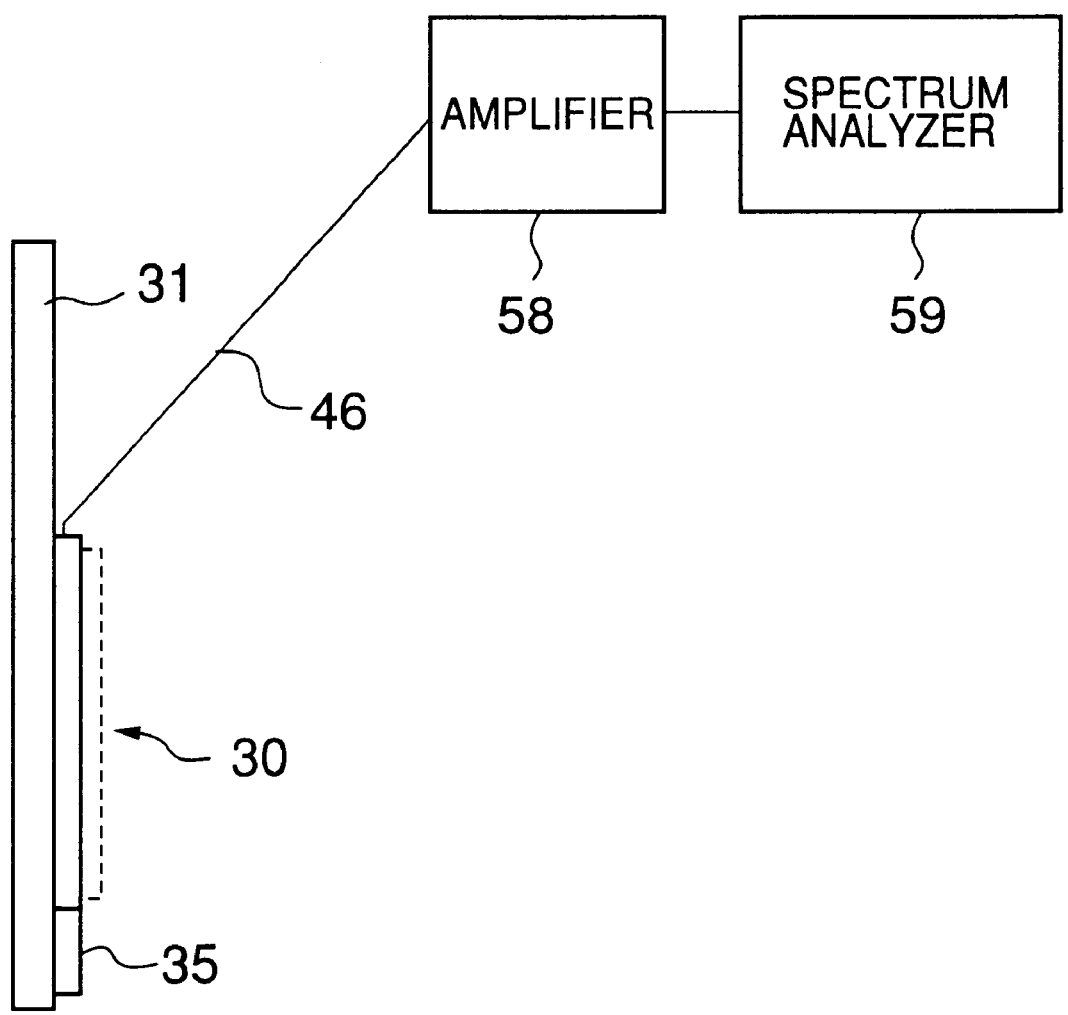
FIG. 20 is a diagram for explaining a construction of a magnetic field measuring system in which the probe is provided.

FIG. 20 shows a construction of a magnetic field measuring system in which the probe of FIG. 10B is provided.

As shown in FIG. 20, in the magnetic field measuring system of the present embodiment, the probe 30 which is the same as the probe 30A of FIG. 10B is provided. An amplifier 58 is connected at its inputs to the pads of the probe 30 via a coaxial cable 46. The amplifier 58 provides amplification of a magnetic field signal output by the coil 35 of the probe 30. An output of the amplifier 58 is connected to a spectrum analyzer 59. The spectrum analyzer 59 provides a detection of the magnetic field based on an amplified signal output by the amplifier 58 so that a magnetic field measurement for a DUT is performed based on the detection of the magnetic field.

In the above-described embodiment of FIG. 20, a magnetic field signal from the probe 30 is transmitted to the spectrum analyzer 59 via the coaxial cable 46, so that a measurement of the magnetic field from the DUT when the probe 30 is placed at a specified point with respect to the DUT can be performed with high accuracy. Therefore, a distribution measurement of the magnetic field from the DUT can be performed by the magnetic field measuring system of FIG. 20 with high accuracy. Further, in the above-described embodiment, the amplifier 58 provides adequate amplification of the magnetic field signal from the DUT, and it is possible for the magnetic field measuring system of FIG. 20 to perform accurate detection of a small magnetic field from the DUT.

In the above-described embodiment of FIG. 20, the probe 30A of FIG. 10B is provided to form the magnetic field measuring system. Alternatively, one of the probe 30B of FIG. 12B, the probe 30C of FIG. 14B, and the probe 30 of FIG. 15D may be provided to form the magnetic field measuring system of FIG. 20.

FIG. 21A through FIG. 21D show a method of production of a further embodiment of the magnetic field probe of the present invention. FIG. 22A and FIG. 22B show the method of production of the embodiment of the magnetic field probe of FIGS. 21A–21D.

Similar to the embodiment of FIG. 20, the magnetic field probe 30' of the present embodiment has an amplifier connected to the probe 30'. In the present embodiment, the amplifier is an amplifier chip which is provided on a substrate of the probe 30', and a number of additional pads are provided on the substrate for connecting such a chip to the probe 30'. The probe 30' may be one of the probe 30A of FIG. 10B, the probe 30B of FIG. 12B, the probe 30C of FIG. 14B, and the probe 30 of FIG. 15D.

In order to facilitate understanding of the magnetic field probe 30' of the present embodiment, a description will be given of a method of production of the magnetic field probe 30' with reference to FIGS. 21A–21D and 22A–22B.

Figure 21A:
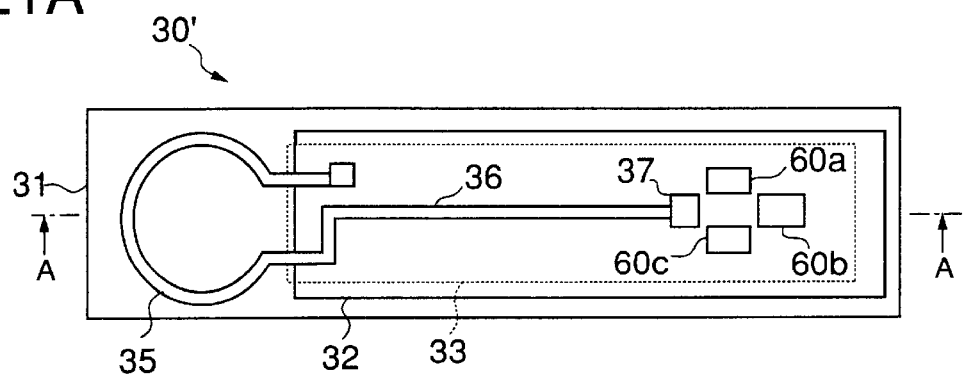
FIG. 21A through FIG. 21D are views of a further embodiment of the magnetic field probe of the present invention for explaining a method of production thereof.
Figure 21C:
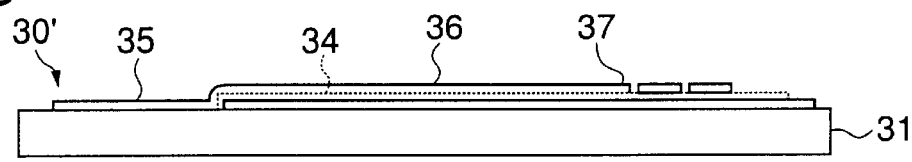
Figure 22A:
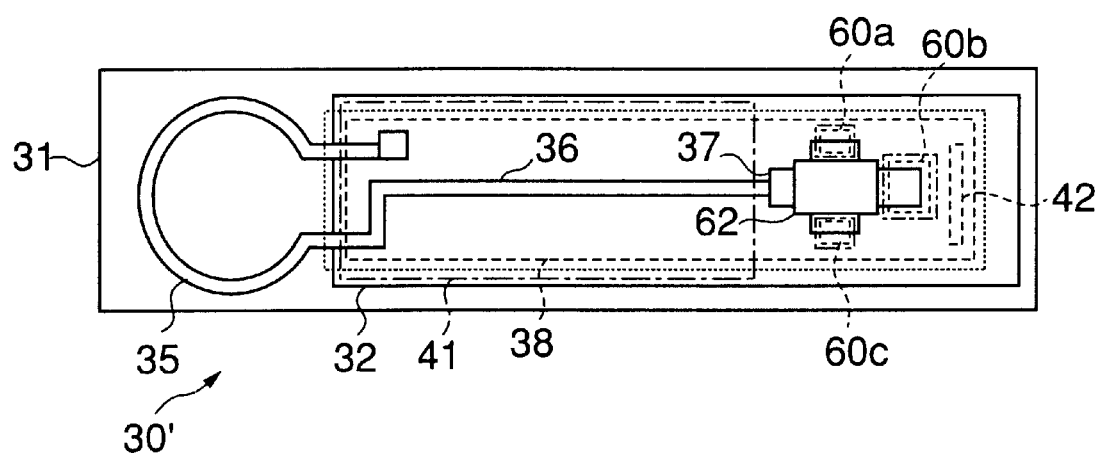
FIG. 22A and FIG. 22B are views of the embodiment of the magnetic field probe of FIGS. 21A–21D for explaining the method of production thereof.
Figure 22B:
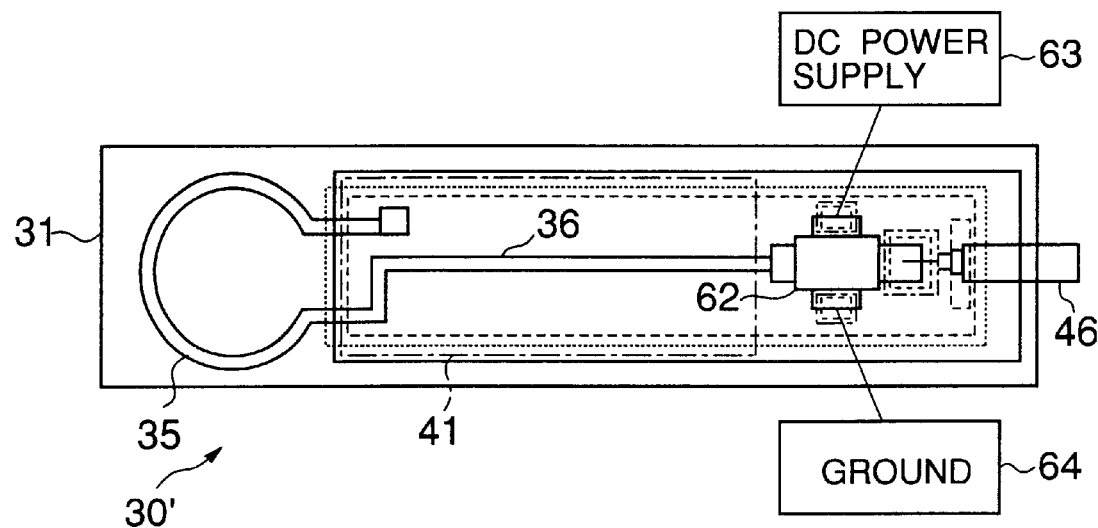

FIG. 21A is a top view of the magnetic field probe 30' of the present embodiment at a first step of the method of production thereof, and FIG. 21C is a cross-sectional view of the probe 30' taken along a line A—A in FIG. 21A. The magnetic field probe 30' of the present embodiment is produced as follows.

First, similar to the embodiment of FIG. 9C, the second conductive layer 34 is formed on the first isolating layer 33 by the aluminum layer. As shown in FIG. 21A, the first conductive layer 32 is formed on the substrate 31 by the aluminum layer similar to that shown in FIG. 9A, and the first isolating layer 33 is formed on the first conductive layer 32 by the silicon dioxide layer similar to that shown in FIG. 9B. The second conductive layer 34 includes the coil 35, the internal conductor 36, and the first pad 37 extending from the internal conductor 36. The internal conductor 36 and the first pad 37 are provided on the first isolating layer 33, and the coil 35 has one end connected to the outer peripheral portion of the first conductive layer 32, and has the other end connected to the end portion of the internal conductor 36. The internal conductor 36 is connected at the other end to the first pad 37.

Also, as shown in FIG. 21A, three additional pads 60a, 60b and 60c are formed on the first isolating layer 33 by the aluminum layer. The pads 60*a*–60*c* are provided on the substrate 31 for connecting an amplifier chip (not shown in FIG. 21A) to the probe 30'.

Figure 21B:
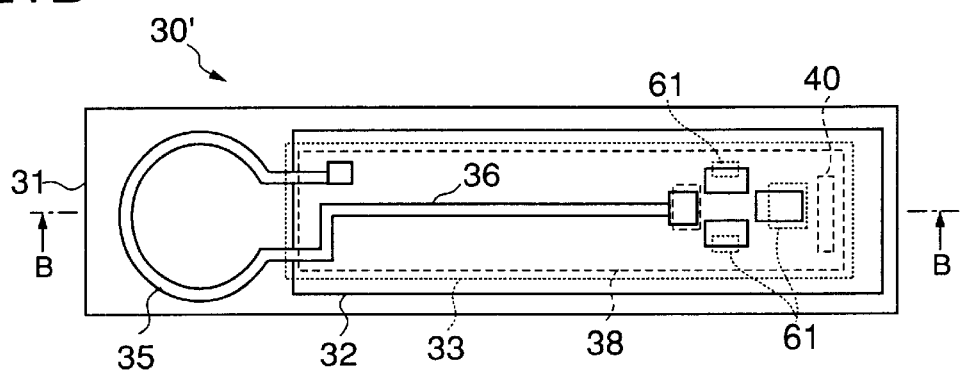
Figure 21D:
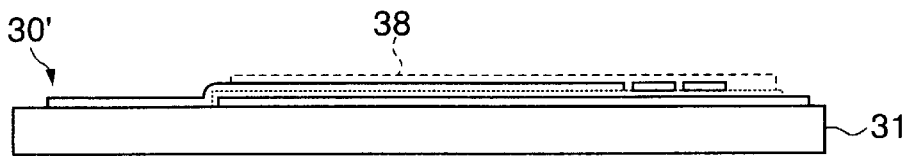

FIG. 21B is a top view of the magnetic field probe 30' of the present embodiment at a second step of the method of production thereof, and FIG. 21D is a cross-sectional view of the probe 30' taken along a line B—B in FIG. 21B.

Second, when the second isolating layer 38 is formed on the second conductive layer 34 by the silicon dioxide layer (similar to that in FIG. 10A), a number of through holes 61 are concurrently formed in the second isolating layer 38 at upper portions of the first pad 37 and the additional pads 60*a*–60*c*, and the through hole 40 is concurrently formed in the second isolating layer 38 at the upper portion of the rear end of the first isolating layer 33. The second isolating layer 38 is provided at a position that is substantially the same as the position of the first isolating layer 33. One of the through holes 61 enables an external conductor to be connected to the first pad 37 inside the second isolating layer 38, and the other through holes 61 enable an amplifier chip to be connected to the probe 30'. One of the lead wires from the coil 35 can be connected to the external conductor via the first pad 37.

In the present embodiment, a power line of an amplifier chip and a DC power supply are connected to the pad 60$a$, an output signal line of the amplifier chip and an internal conductor of a coaxial cable are connected to the pad 60$b$, and a ground line of the amplifier chip and a ground line of the DC power supply are connected to the pad 60$c$. An input signal line of the amplifier chip is connected to the first pad 37.

FIG. 22A is a top view of the magnetic field probe 30' of the present embodiment at a third step of the method of production thereof.

After the probe 30' in which the first pad 37 and the additional pads 60$a$–60$c$ are provided on the substrate 31 is formed, an amplifier chip 62 is connected to the probe 30' via the pads 37 and 60$a$–60$c$. As shown in FIG. 22A, the third conductive layer 41 is formed on the second isolating layer 38 by the aluminum layer similar to that shown in FIG. 10B. Also, the second pad 42 is formed at the position of the through hole 40 which is located at the upper portion of the rear end of the first isolating layer 33. The through hole 40 enables the second pad 42 to be formed at the above-mentioned position thereof. The other of the lead wires from the coil 35 can be connected to an external conductor via the second pad 42.

FIG. 22B is a top view of the magnetic field probe 30' of the present embodiment at a final step of the method of production thereof.

Finally, as shown in FIG. 22B, a DC power supply 63 and a ground 64 are connected to the amplifier chip 62 via the pads 60$a$ and 60$c$, respectively. The internal conductor of the coaxial cable 46 is connected to the amplifier chip 62 via the pad 60$b$, and the external conductor of the coaxial cable 46 is connected to the second pad 42.

In the above-described embodiment, the magnetic field probe 30' of FIG. 22B can perform, with high accuracy, a magnetic field measurement when the probe 30' is placed at a specified point with respect to a DUT. Therefore, in a magnetic field measuring system including the probe 30' of FIG. 22B, a measurement of distribution of the magnetic field from the DUT can be performed with high accuracy, similar to the embodiment of FIG. 20. Further, in the above-described embodiment, the amplifier chip 62 can be provided at a location adjacent to the coil 35 of the probe 30', and the probe 30' having the amplifier chip 62 provides an improved signal-to-noise (S/N) ratio. The probe 30' of the present embodiment provides adequate amplification of the magnetic field signal from the DUT with higher accuracy, and it is possible for the probe 30' to perform more accurate detection of a small magnetic field from the DUT.

Figure 23:
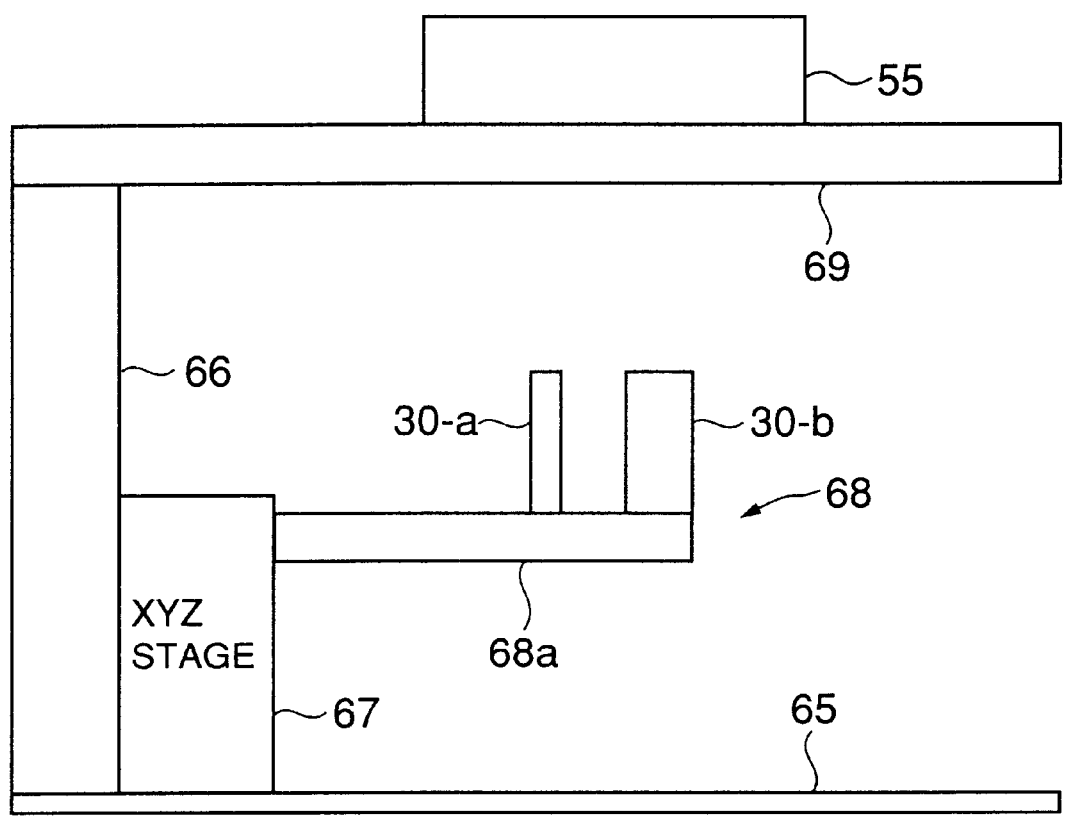
FIG. 23 is a diagram for explaining a construction of another magnetic field measuring system in which the large-size and small-size magnetic field probes are provided.

FIG. 23 shows a construction of another magnetic field measuring system in which a large-size-coil probe and a small-size-coil probe as shown in FIG. 19 are provided.

As shown in FIG. 23, in the magnetic field measuring system 68 of the present embodiment, the small-size-coil probe 30-$a$ and the large-size-coil probe 30-$b$ as shown in FIG. 19 are supported on a probe supporting board 68$a$, and the probe supporting board 68-$a$ is attached to an XYZ stage 67. Similar to the embodiment of FIG. 19, the probe 30-$a$ has the small-size coil 35-$a$ which is the same as the coil 35 of the probe 30A of FIG. 10B, and the probe 30-$b$ has the large-size coil 35-$b$ which is larger than the small-size coil 35-$a$. The XYZ stage 67 moves the probe 30-$a$ and the probe 30-$b$ to a specified point with respect to a device under test (DUT) 55 in a three-dimensional manner. A supporting member 66 is fixed to a base 65, and the XYZ stage 67 is supported on the supporting member 66. The DUT 55 is positioned and fixed to a DUT supporting board 69, and the DUT supporting board 69 is fixed to the base 65 through the supporting member 66.

In the magnetic field measuring system of FIG. 23, a spectrum analyzer (not shown) is connected to the pads of the probe 30-$a$ and the probe 30-$b$ on the XYZ stage 67 via coaxial cables or the like. Before detecting a magnetic field from the DUT 55, the XYZ stage 67 moves the probe 30-$a$ and the probe 30-$b$ to a specified point with respect to the DUT 55 in a three-dimensional manner. The movement of the probe 30-$a$ and the probe 30-$b$ to the specified point can be performed with high accuracy by the XYZ stage 67. A magnetic field signal from one of the probe 30-$a$ and the probe 30-$b$ is transmitted to the spectrum analyzer via the coaxial cable, so that a measurement of the magnetic field from the DUT 14 when one of the probe 30-$a$ and the probe 30-$b$ is placed at a specified point with respect to the DUT 55 can be performed with high accuracy. Therefore, a distribution measurement of the magnetic field from the DUT 55 can be performed by the magnetic field measuring system of FIG. 23 with high accuracy.

Further, in the magnetic field measuring system of FIG. 23, when it is desired to quickly detect a portion of the DUT 55 which produces a high strength magnetic field, a rough measurement of the magnetic field for a wide range of the DUT 55 is first performed by using the large-size-coil probe 30-$b$, and then an exact measurement of the magnetic field for a selected range of the DUT is performed by using the small-size-coil probe 30-$a$. Therefore, the magnetic field measuring system 68 of the present embodiment is useful when it is desired to quickly and accurately detect a portion of the DUT which produces a high magnetic field.

In the above-described embodiment, the probe 30-$a$ may be the same as one of the probe 30A of FIG. 10B, the probe 30B of FIG. 12B, the probe 30C of FIG. 14B, and the probe 30 of FIG. 15D.

Figure 24:
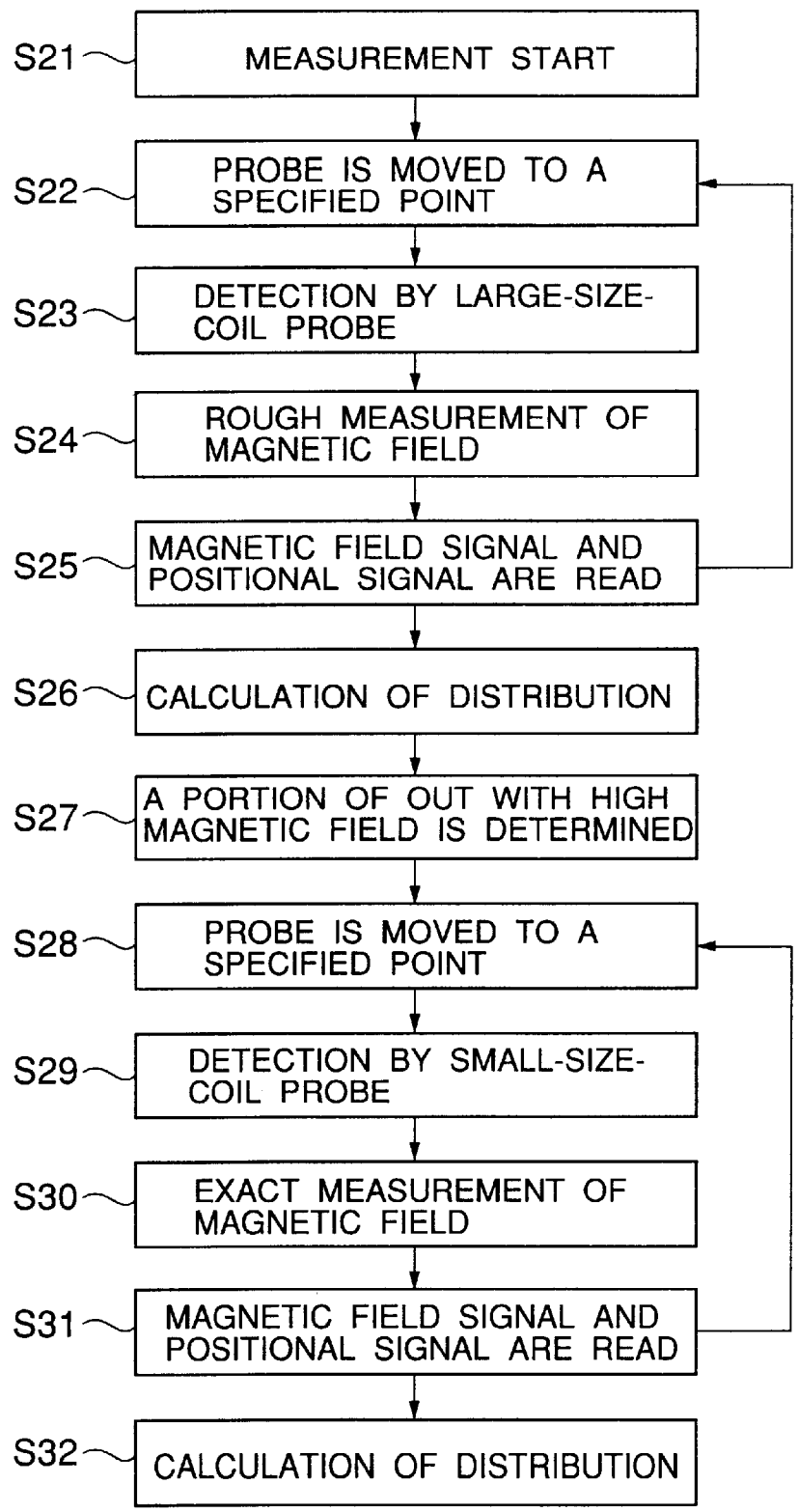
FIG. 24 is a flowchart for explaining a measurement procedure performed with the magnetic field measuring system of FIG. 23.

FIG. 24 shows a measurement procedure performed by using the magnetic field measuring system of FIG. 23 when it is desired to quickly detect a portion of the DUT which produces a high strength magnetic field.

As shown in FIG. 24, in the magnetic field measuring system of FIG. 23, when a magnetic field measurement is started (S21), the DUT 55 is positioned and fixed to the DUT supporting board 69, and the DUT supporting board 69 is fixed to the base 65 through the supporting member 66. In this procedure, a rough measurement of the magnetic field for a wide range of the DUT 55 is first performed by using the large-size-coil probe 30-$b$, and then an exact measurement of the magnetic field for a selected range of the DUT 55 is performed by using the small-size-coil probe 30-$a$.

Before detecting a magnetic field of the DUT 55 in the vicinity of the probe 30-$b$, the XYZ stage 67 moves the probe 30-$b$ to a specified point with respect to the DUT 55 in a three-dimensional manner (S22). The movement of the probe 30-$b$ to the specified point can be performed with high accuracy by the XYZ stage 67 under control of a data processing device (not shown). After the probe 30-*b* is moved to the specified point, a magnetic field signal output by the large-size coil 35-*b* of the probe 30-*b* due to the DUT 55 is detected (S23). A positional signal indicating the specified point of the probe 30-*b* as a result of the movement of the probe 30-*b* is transmitted from the XYZ stage 67 to the data processing device. A magnetic field signal from the probe 30-*b* at the specified point is transmitted to the data processing device through the spectrum analyzer, so that a rough measurement of the magnetic field from the DUT 55 when the probe 30-*b* is placed at the specified point with respect to the DUT 55 is performed by the data processing device (S24). The data processing device reads the magnetic field signal from the probe 30-*b* and the positional signal from the XYZ stage 67 (S25). The above steps S22–S25 are repeated for each specified point of the movement of the probe 30-*b*.

After the rough magnetic field measurement is finished, the data processing device provides mapping of the measured magnetic field at the specified points for the probe 30-*b* into a distribution of the magnetic field based on the amplitude of the magnetic field signal from the probe 30-*b* (S26). The calculated distribution of the magnetic field from the DUT 55 is displayed on a monitor screen of the data processing device. In accordance with the calculated distribution of the magnetic field, a portion of the DUT 55 with a relatively high strength magnetic field is determined (S27). That is, a selected range of the DUT 55 for which an exact measurement of the magnetic field is performed by using the probe 30-*a* is determined.

Before detecting a magnetic field of the DUT 55 in the vicinity of the probe 30-*a*, the XYZ stage 67 moves the probe 30-*a* to a specified point with respect to the selected range of the DUT 55 in a three-dimensional manner (S28). The movement of the probe 30-*a* to the specified point can be performed with high accuracy by the XYZ stage 67 under control of the data processing device. After the probe 30-*a* is moved to the specified point, a magnetic field signal output by the small-size coil 35-*a* of the probe 30-*a* due to the DUT 55 is detected (S29). A positional signal indicating the specified point of the probe 30-*a* as a result of the movement of the probe 30-*a* is transmitted from the XYZ stage 67 to the data processing device. A magnetic field signal from the probe 30-*a* at the specified point is transmitted to the data processing device through the spectrum analyzer, so that an exact measurement of the magnetic field from the DUT 55 when the probe 30-*a* is placed at the specified point with respect to the DUT 55 is performed by the data processing device (S30). The data processing device reads the magnetic field signal from the probe 30-*a* and the positional signal from the XYZ stage 67 (S31). The above steps S28–S31 are repeated for each specified point of the movement of the probe 30-*a*.

After the exact magnetic field measurement is finished, the data processing device provides mapping of the measured magnetic field at the specified points for the probe 30-*a* into a distribution of the magnetic field based on the amplitude of the magnetic field signal from the probe 30-*a* (S32). The calculated distribution of the magnetic field from the DUT 55 is displayed on the monitor screen of the data processing device. Therefore, a distribution measurement of the magnetic field from the DUT 55 can be easily performed with high accuracy by the magnetic field measuring system of FIG. 23, and it is possible to quickly and accurately detect a portion of the DUT 55 which produces a high strength magnetic field.

In the above-described embodiment of FIG. 23, the probe 30-*a* and the probe 30-*b* are individually attached to the XYZ stage 67 to form the magnetic field measuring system. Alternatively, a probe unit in which the probe 30-*a* and the probe 30-*b* are supported on a probe supporting board may be attached to the XYZ stage 67 to form another magnetic field measuring system of the present invention.

Figure 25:
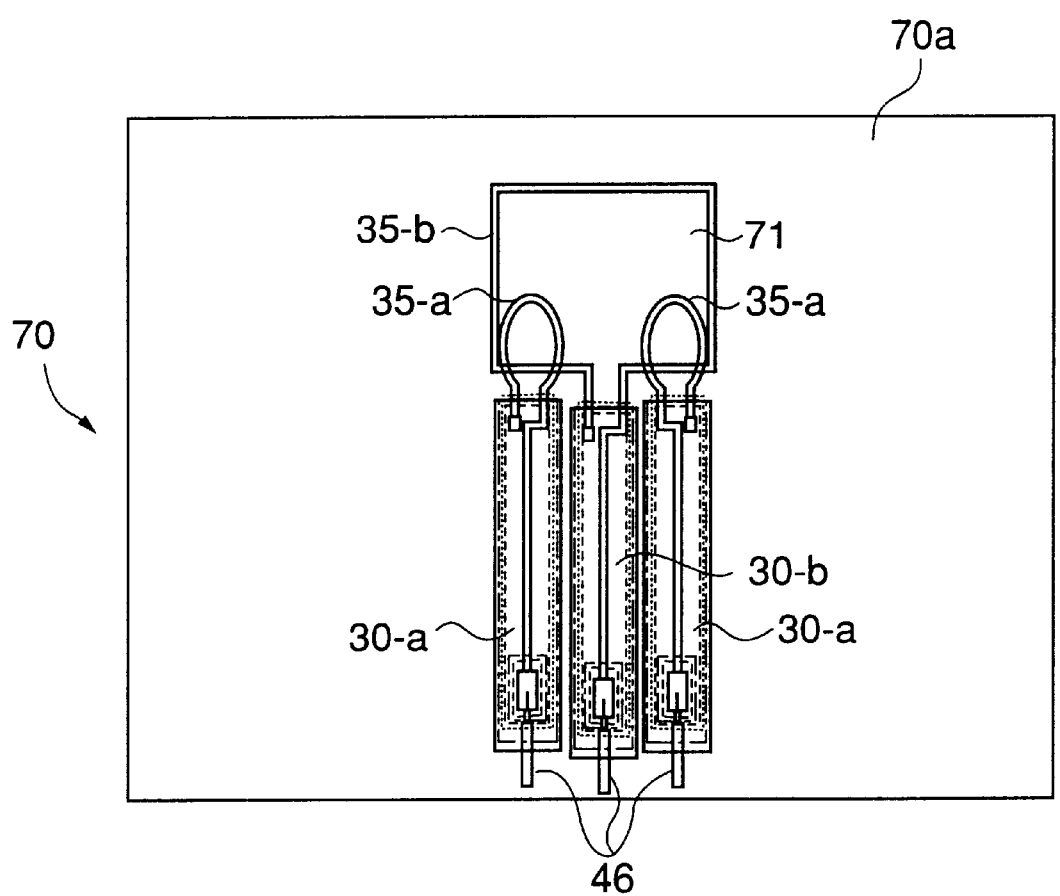
FIG. 25 is a diagram for explaining a construction of a further magnetic field measuring system in which the large-size and small-size magnetic field probes are provided.

FIG. 25 shows a construction of such a probe unit to form another magnetic field measuring system of the present invention. FIG. 25 is a top view of the probe unit 70 of the present embodiment.

As shown in FIG. 25, the probe unit 70 of the present embodiment generally has a probe supporting board 70*a*, the two small-size-coil probes 30-*a*, and the large-size-coil probe 30-*b*. The probes 30-*a* and the probe 30-*b* are provided on the probe supporting board 70*a*. In the probe unit 70, the small-size coils 35-*a* and the. large-size coil 35-*b* overlap each other, but an isolating layer 72 is provided between the coils 35-*a* and the coil 35-*b* to avoid an electrical connection between the coils 35-*a* and the coil 35-*b*. Similar to the embodiment of FIG. 23, in a magnetic field measuring system in which the probe unit 70 is attached to the XYZ stage 67, it is possible to quickly and accurately detect a portion of the DUT 55 which produces a high strength magnetic field.

In the above-described embodiment, the probes 30-*a* may be the same as one of the probe 30A of FIG. 10B, the probe 30B of FIG. 12B, the probe 30C of FIG. 14B, and the probe 30 of FIG. 15D.

FIG. 26 shows a construction of another magnetic field measuring system in which a spectrum analyzer is connected to the probe.

As shown in FIG. 26, in the magnetic field measuring system of the present embodiment, the probe 30 is attached to the XYZ stage 67 through a supporting member 72 similar to the embodiment of FIG. 23. The spectrum analyzer 59 is connected to the pads of the probe 30 via the coaxial cable 46. The spectrum analyzer 59 provides detection of a magnetic field signal output by the coil of the probe 30, so that a magnetic field measurement for the DUT 55 is performed based on the detection of the magnetic field. The spectrum analyzer 59 forms a magnetic field detecting unit in the magnetic field measuring system of the present invention.

Other elements of the magnetic field measuring system of FIG. 26 have a construction that is essentially the same as the construction of corresponding elements of the embodiment of FIG. 23, and a duplicate description thereof will be omitted.

In the above-described embodiment of FIG. 26, before detecting a magnetic field from the DUT 55 in the vicinity of the probe 30, the XYZ stage 67 moves the probe 30 to a specified point with respect to the DUT 55 in a three-dimensional manner. The movement of the probe 30 to the specified point can be performed with high accuracy by the XYZ stage 67. A magnetic field signal from the probe 30 is transmitted to a data processing device (not shown) in the magnetic field measuring system via the coaxial cable 46, so that a measurement of the magnetic field from the DUT 55 at each specified point for the probe 30 can be performed with high accuracy. Therefore, a measurement of distribution of the magnetic field from the DUT 55 can be performed by the magnetic field measuring system of FIG. 26 with high accuracy.

In the above-described embodiment, the probe 30 may be the same as one of the probe 30A of FIG. 10B, the probe 30B of FIG. 12B, the probe 30C of FIG. 14B, and the probe 30 of FIG. 15D.

FIG. 27A through FIG. 27F show a method of production of another embodiment of the magnetic field probe of the present invention.

In the present embodiment, the magnetic field probe 30D includes first and second conductive layers provided on a substrate, and a coil, coplanar transmission lines and pads are formed by the first conductive layer to establish electrical connections between the coil, the coplanar transmission lines and the pads. The second conductive layer is provided on the first conductive layer through an isolating layer to protect the transmission lines between the coil and the pads on the substrate.

In order to facilitate understanding of the magnetic field probe 30D of the present embodiment, a description will be given of a method of production of the magnetic field probe 30D of the present embodiment with reference to FIGS. 27A–27F.

Figure 27A:
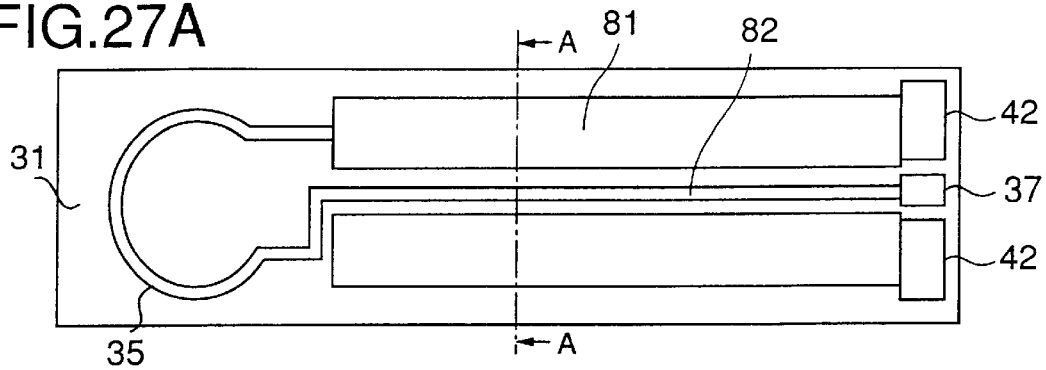
FIG. 27A through FIG. 27F are views of another embodiment of the magnetic field probe of the present invention for explaining a method of production thereof.
Figure 27D:
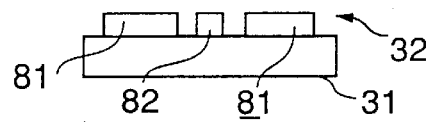

FIG. 27A is a top view of the magnetic field probe of the present embodiment at a first step of the method of production thereof, and FIG. 27D is a cross-sectional view of the magnetic field probe taken along a line A—A in FIG. 27A. The magnetic field probe 30D of the present embodiment is produced as follows.

First, a thin film of aluminum (Al) is deposited on a substrate 31 of quartz by sputtering. A photolithographic process and a wet etching process are performed so that a first conductive layer 32 is formed on the substrate 31 by the aluminum layer. In the first conductive layer 32, as shown in FIG. 27A, the coil 35, external conductors 81 of the coplanar transmission lines, an internal conductor 82 of the coplanar transmission lines, the first pad 37, and the second pads 42 are provided as shown in FIG. 27A.

Figure 27B:
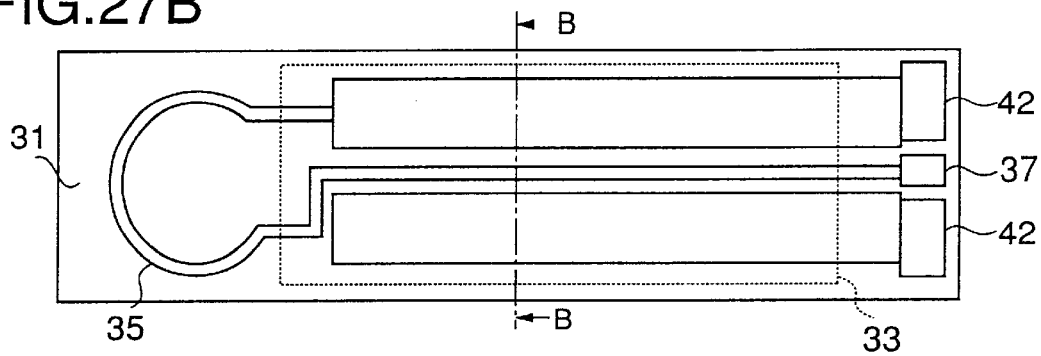
Figure 27E:
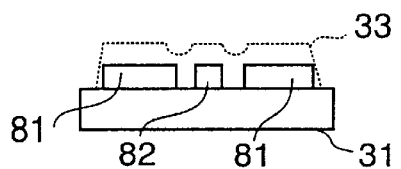

FIG. 27B is a top view of the magnetic field probe of the present embodiment at a second step of the method of production thereof, and FIG. 27E is a cross-sectional view of the magnetic field probe taken along a line B—B in FIG. 27B.

Second, a thin film of silicon dioxide ($SiO_2$) is deposited on the first conductive layer 32 by sputtering. A photolithographic process and a reactive ion etching process are performed so that a first isolating layer 33 is formed on the first conductive layer 32 by the silicon dioxide layer as indicated by a dotted line in FIG. 27B. The first isolating layer 33 is provided to protect the top and sides of the coplanar transmission lines 81 and 82 between the coil 35 and the pads 37 and 42 on the substrate 31.

Figure 27C:
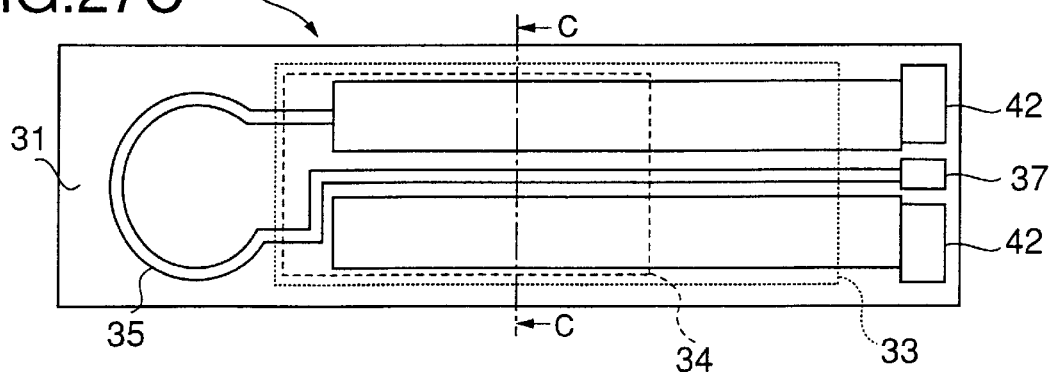
Figure 27F:
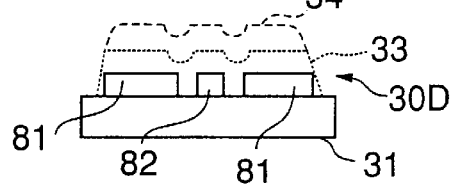

FIG. 27C is a top view of the magnetic field probe 30D of the present embodiment at a final step of the method of production thereof, and FIG. 27F is a cross-sectional view of the magnetic field probe 30D taken along a line C—C in FIG. 27C.

Finally, a thin film of aluminum is deposited on the first isolating layer 33 by sputtering, and a photolithographic process and a wet etching process, which are the same as those mentioned above, are performed so that a second conductive layer 34 is formed on the first isolating layer 33 by the aluminum layer as shown in FIG. 27C and FIG. 27F. The second conductive layer 34 is provided to protect the first isolating layer 33.

In the magnetic field probe 30D of the present embodiment as shown in FIG. 27C, the top and sides of the internal conductor 82 of the transmission lines (the first conductive layer 32) are protected by the first isolating layer 33, and the first isolating layer 33 is protected by the second conductive layer 34. Therefore, the magnetic field probe 30D of the present embodiment is effective in preventing distortion of the magnetic field at the internal conductor 82 between the coil 35 and the pads 37 and 42 within the probe 30D, and it is possible to provide adequate accuracy for the magnetic field measurement of the device under test.

In the above-described embodiment, the coil 35, the coplanar transmission lines 81 and 82, and the pads 37 and 42 are made of aluminum (Al). Alternatively, other metallic materials such as silver (Ag), gold (Au) and platinum (Pt) may be used to form these elements on the substrate 31. In the above-described embodiment, the substrate 31 is made of quartz. Alternatively, one of other isolating substrate materials or flexible isolating substrate materials (such as polyethylene terephthalate and polyimide) may be used to form the substrate 31.

In the above-described production method, the sputtering process is used to form the first conductive layer 32 of the coil 35, the coplanar transmission lines 81 and 82 and the pads 37 and 42 on the substrate 31. Alternatively, another conductive layer forming method such as a vapor deposition process may be used to form the first conductive layer 32 on the substrate 31. In the above-described production method, the sputtering process is used to form the first isolating layer 33 of silicon dioxide on the first conductive layer 32. Alternatively, another isolating layer forming method such as an electron beam deposition process or a chemical vapor deposition process may be used to form the first isolating layer 33. In addition, the first isolating layer 33 is made of silicon dioxide ($SiO_2$) in the above-described embodiment, but another isolating material such as $Si_3N_4$ may be used instead. Further, in the above-described production method, the wet etching process is used for etching of the first isolating layer 33. If an etching of the substrate 31 is performed, it is necessary to protect the bottom surface of the substrate 31 from the etchant by a resist when such an etching is performed.

Further, the present invention is not limited to the above-described embodiments, and variations and modifications may be made without departing from the scope of the present invention.

What is claimed is:

1. A magnetic field probe comprising:
   a substrate;
   a flat conductive layer, provided on the substrate, having a coil, lead wires, and pads, the coil having at least one turn and outputting a signal indicative of a magnetic field enclosed by the coil, the lead wires extending from the coil to the pads, the signal from the coil being transmitted to the pads through the lead wires;
   an isolating layer of a dielectric material provided on the lead wires to protect the lead wires between the coil and the pads in the conductive layer; and
   a shielding layer of a conductive material provided on the isolating layer to protect the isolating layer, wherein the shielding layer prevents distortion of the magnetic field at the lead wires in conjunction with the isolating layer.

2. The magnetic field probe according to claim 1, further comprising an impedance transformer connected to the pads in the conductive layer, the impedance transformer providing matching of impedance of the magnetic field probe for a magnetic field measuring system.

3. A magnetic field measuring unit, comprising:
   at least one probe; and
   a probe supporting member for supporting said at least one probe thereon, said at least one probe comprising:
   a substrate;
   a flat conductive layer, provided on the substrate, having a coil, lead wires, and pads, the coil having at least one turn and outputting a signal indicative of a magnetic field enclosed by the coil, the lead wires extending from the coil to the pads, the signal from the coil being transmitted to the pads through the lead wires;

an isolating layer of a dielectric material provided on the lead wires to protect the lead wires between the coil and the pads in the conductive layer; and a shielding layer of a conductive material provided on the isolating layer to protect the isolating layer, wherein the shielding layer prevents distortion of the magnetic field at the lead wires in conjunction with the isolating layer.

4. The magnetic field measuring system according to claim 3, wherein the magnetic field measuring system includes:

a plurality of probes; and a probe supporting rod having a plurality of end surfaces, the plurality of end surfaces facing specified directions different from a longitudinal axial direction of the probe supporting rod, each of the plurality of end surfaces having one of the plurality of probes provided thereon.

5. The magnetic field measuring system according to claim 3, wherein the magnetic field measuring system includes:

an array of probes in which the probes are orderly arranged in rows and columns in a two-dimensional manner; and a probe supporting board for supporting the array of probes thereon.

6. The magnetic field measuring system according to claim 3, further comprising a probe moving unit for moving said at least one probe to a specified point relative to a device under test in a three-dimensional manner.

7. The magnetic field measuring system according to claim 6, further comprising:

an amplifier connected to the pads of said at least one probe for providing amplification of the signal from the coil of said at least one probe; and a magnetic field detecting unit connected to the amplifier for detecting the magnetic field based on an amplified signal output by the amplifier so that a magnetic field measurement for the device is performed based on the detection of the magnetic field.

8. The magnetic field measuring system according to claim 7, further comprising a data processing device connected to each of the probe moving unit and the magnetic field detecting unit, the data processing device providing execution of processing of magnetic field measurement data output by the magnetic field detecting unit, and providing execution of processing of positional data of said at least one probe output by the probe moving unit.

9. A magnetic field probe comprising:

a substrate;

a first conductive layer provided on the substrate to partially cover the substrate, the first conductive layer having an external peripheral portion;

a first isolating layer provided on the first conductive layer to overlap with the first conductive layer;

a second conductive layer provided on the first isolating layer, the second conductive layer having a coil, an internal conductor, and a first pad, the coil having a first end connected to the external peripheral portion of the first conductor layer and having a second end connected to the internal conductor, the coil outputting a signal indicative of a magnetic field from a device under test in a vicinity of the probe, the internal conductor extending from the coil to the first pad, the signal from the coil being transmitted to the first pad through the internal conductor;

a second isolating layer provided on both the first isolating layer and the second conductive layer to overlap with the first isolating layer so that the internal conductor in the second conductive layer is protected by the second isolating layer; and a third conductive layer provided on the second isolating layer, the third conductive layer being connected to the first conductive layer at positions on both sides of the internal conductor so that the first and the third conductive layers form a shielding layer to protect the internal conductor in the second conductive layer, the shielding layer preventing distortion of the magnetic field at the internal conductor in conjunction with the second isolating layer, wherein a second pad is provided in the third conductive layer, the second pad being connected to the first end of the coil through the external peripheral portion of the first conductive layer.

10. The magnetic field probe according to claim 9, wherein the third conductive layer has an opening which encircles the first pad in the second conductive layer, the opening avoiding electrical connection between the third conductive layer and the first pad, and wherein the second pad is formed by a corresponding portion of the third conductive layer around the opening.

11. The magnetic field probe according to claim 9, further comprising:

a coaxial cable being connected to the probe, the cable having an internal conductor and an external conductor, the internal conductor of the cable being connected to the first pad of the probe, the external conductor of the cable being connected to the second pad of the probe; and a conductive material for protecting the connection between the internal conductor of the cable and the first pad through an isolating layer, the conductive material being integrally attached to the connection between the external conductor of the cable and the second pad, so that the conductive material fully covers both the connection between the internal conductor and the first pad and the connection between the external conductor and the second pad.

12. A magnetic field measuring system comprising:

at least one probe; and a probe supporting member for supporting said at least one probe thereon, said at least one probe comprising:

a substrate;

a first conductive layer provided on the substrate to partially cover the substrate, the first conductive layer having an external peripheral portion;

a first isolating layer provided on the first conductive layer to overlap with the first conductive layer;

a second conductive layer provided on the first isolating layer, the second conductive layer having a coil, an internal conductor, and a first pad, the coil having a first end connected to the external peripheral portion of the first conductor layer and having a second end connected to the internal conductor, the coil outputting a signal indicative of a magnetic field from a device under test in a vicinity of the probe, the internal conductor extending from the coil to the first pad, the signal from the coil being transmitted to the first pad through the internal conductor;

a second isolating layer provided on both the first isolating layer and the second conductive layer to overlap with the first isolating layer so that the internal conductor in the second conductive layer is protected by the second isolating layer; and a third conductive layer provided on the second isolating layer, the third conductive layer being connected to the first conductive layer at positions on both sides of the internal conductor so that the first and the third conductive layers form a shielding layer to protect the internal conductor in the second conductive layer, the shielding layer preventing distortion of the magnetic field at the internal conductor in conjunction with the second isolating layer, wherein a second pad is provided in the third conductive layer, the second pad being connected to the first end of the coil through the external peripheral portion of the first conductive layer.

13. The magnetic field measuring system according to claim 12, wherein the magnetic field measuring system includes:

a plurality of probes; and a probe supporting rod having a plurality of end surfaces, the plurality of end surfaces facing specified directions different from a longitudinal axial direction of the probe supporting member, each of the plurality of end surfaces having one of the plurality of probes provided thereon.

14. The magnetic field measuring system according to claim 12, wherein the magnetic field measuring system includes:

an array of probes in which the probes are orderly arranged in rows and columns in a two-dimensional manner; and a probe supporting board for supporting the array of probes thereon.

15. The magnetic field measuring system according to claim 14, wherein the array of probes includes coils having at least two different sizes.

16. The magnetic field measuring system according to claim 12, further comprising:

an amplifier connected to said at least one probe for providing amplification of a magnetic field signal from said at least one probe; and a magnetic field detecting unit connected to the amplifier for detecting the magnetic field based on an amplified signal output by the amplifier so that a magnetic field measurement for the device under test is performed based on the detection of the magnetic field.

17. The magnetic field measuring system according to claim 16, wherein said amplifier is an amplifier chip provided on the substrate of said at least one probe, and said at least one probe includes a number of additional pads provided on the substrate, the amplifier chip being connected to said at least one probe via the number of additional pads.

18. The magnetic field measuring system according to claim 12, wherein the magnetic field measuring system includes a plurality of probes, the plurality of probes including coils having at least two different sizes.

19. The magnetic field measuring system according to claim 12, further comprising:

a probe moving unit for moving said at least one probe to a specified point relative to a device under test in a three-dimensional manner; and a magnetic field detecting unit connected to said at least one probe for detecting a magnetic field signal from said at least one probe, so that a magnetic field measurement for the device under test is performed based on the detection of the magnetic field.

* * * * *